United States Patent
Cheng et al.

(10) Patent No.: US 10,991,811 B2
(45) Date of Patent: Apr. 27, 2021

(54) STRUCTURE AND FORMATION METHOD OF SEMICONDUCTOR DEVICE STRUCTURE WITH NANOWIRES

(71) Applicant: Taiwan Semiconductor Manufacturing Co., Ltd., Hsinchu (TW)

(72) Inventors: Chao-Ching Cheng, Hsinchu (TW); Wei-Sheng Yun, Taipei (TW); Shao-Ming Yu, Zhubei (TW); Tsung-Lin Lee, Hsinchu (TW); Chih-Chieh Yeh, Taipei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/528,768

(22) Filed: Aug. 1, 2019

(65) Prior Publication Data
US 2019/0355835 A1 Nov. 21, 2019

Related U.S. Application Data

(62) Division of application No. 15/692,124, filed on Aug. 31, 2017, now Pat. No. 10,374,059.

(51) Int. Cl.
*H01L 29/66* (2006.01)
*H01L 21/762* (2006.01)
(Continued)

(52) U.S. Cl.
CPC ........ *H01L 29/66666* (2013.01); *B82Y 10/00* (2013.01); *H01L 21/76205* (2013.01);
(Continued)

(58) Field of Classification Search
CPC . H01L 21/02601–02606; H01L 29/0669–068; H01L 29/413; H01L 31/035227; H01L 51/426–4266; H01L 51/502; H01L 2221/1094; H01L 2924/10325; H01L 2924/13086; H01L 2924/13088; H01L 21/3142; H01L 21/823431; H01L 29/66795–66818; H01L 27/0886; H01L 27/0924; H01L 29/66545;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Thanh Y. Tran
(74) *Attorney, Agent, or Firm* — McClure, Qualey & Rodack, LLP

(57) ABSTRACT

A semiconductor device structure is provided. The semiconductor device structure includes a substrate having a plurality of nanowires over an input-output region, and a protective layer surrounding the nanowires. The protective layer is made of silicon, silicon germanium, silicon oxide, silicon nitride, silicon sulfide, or a combination thereof. The semiconductor device structure also includes a high-k dielectric layer surrounding the protective layer, and a gate electrode surrounding the high-k dielectric layer. The semiconductor device structure further includes a source/drain portion adjacent to the gate electrode, and an interlayer dielectric layer over the source/drain portion.

20 Claims, 43 Drawing Sheets

(51) Int. Cl.
*H01L 29/06* (2006.01)
*H01L 29/423* (2006.01)
*H01L 29/775* (2006.01)
*H01L 29/78* (2006.01)
*H01L 29/786* (2006.01)
*B82Y 10/00* (2011.01)
*H01L 29/08* (2006.01)
*H01L 27/06* (2006.01)
*H01L 27/092* (2006.01)
*H01L 21/822* (2006.01)
*H01L 21/8234* (2006.01)
*H01L 29/417* (2006.01)
*H01L 29/40* (2006.01)
*H01L 29/165* (2006.01)

(52) U.S. Cl.
CPC .. *H01L 21/8221* (2013.01); *H01L 21/823431* (2013.01); *H01L 27/0688* (2013.01); *H01L 27/0924* (2013.01); *H01L 29/0649* (2013.01); *H01L 29/0653* (2013.01); *H01L 29/0673* (2013.01); *H01L 29/0676* (2013.01); *H01L 29/0847* (2013.01); *H01L 29/401* (2013.01); *H01L 29/41725* (2013.01); *H01L 29/42356* (2013.01); *H01L 29/42364* (2013.01); *H01L 29/42392* (2013.01); *H01L 29/66439* (2013.01); *H01L 29/66545* (2013.01); *H01L 29/775* (2013.01); *H01L 29/7827* (2013.01); *H01L 29/7848* (2013.01); *H01L 29/78696* (2013.01); *H01L 29/165* (2013.01)

(58) Field of Classification Search
CPC ......... H01L 29/78696; H01L 21/76205; H01L 29/0649; H01L 29/7848; H01L 29/66666; H01L 21/8221; H01L 29/42356; H01L 29/42392; H01L 29/7827; Y10S 977/755–777; Y10S 977/72–722; Y10S 977/854; Y10S 977/813–826
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2015/0228647 A1* | 8/2015 | Chang | H01L 21/823431 257/401 |
| 2017/0117375 A1* | 4/2017 | Kim | H01L 29/7869 |
| 2017/0154973 A1* | 6/2017 | Ching | H01L 21/32053 |
| 2017/0194213 A1 | 7/2017 | Ching et al. | |
| 2017/0200738 A1* | 7/2017 | Kim | H01L 21/845 |
| 2017/0256608 A1* | 9/2017 | Suk | H01L 29/775 |
| 2018/0069006 A1* | 3/2018 | Kim | H01L 29/42392 |

* cited by examiner

STRUCTURE AND FORMATION METHOD OF SEMICONDUCTOR DEVICE STRUCTURE WITH NANOWIRES

CROSS REFERENCE TO RELATED APPLICATIONS

This application is a Divisional application of U.S. patent application Ser. No. 15/692,124, filed on Aug. 31, 2017, now U.S. Pat. No. 10,374,059, the entire of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a semiconductor device with nanowires, has been introduced to replace planar transistors.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-2 to 1G-2 are cross-sectional views of various stages of a process for forming a semiconductor device structure, in accordance with some embodiments.

FIGS. 2A-1 to 2K-1 are cross-sectional views of various stages of a process for forming a semiconductor device structure, in accordance with some embodiments.

FIGS. 2A-2 to 2K-2 are cross-sectional views of various stages of a process for forming a semiconductor device structure, in accordance with some embodiments.

FIGS. 3A-1 to 3K-1 are cross-sectional views of various stages of a process for forming a semiconductor device structure, in accordance with some embodiments.

FIGS. 3A-2 to 3K-2 are cross-sectional views of various stages of a process for forming a semiconductor device structure, in accordance with some embodiments.

DETAILED DESCRIPTION

Figures 1, 1A:
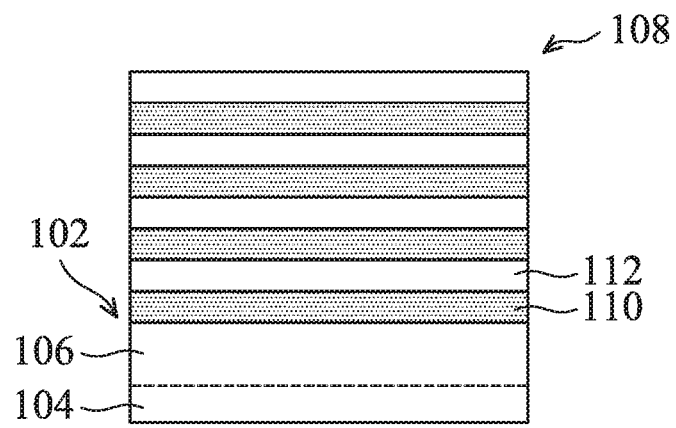
FIGS. 1A-1 to 1G-1 are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figures 1, 1A, 2:
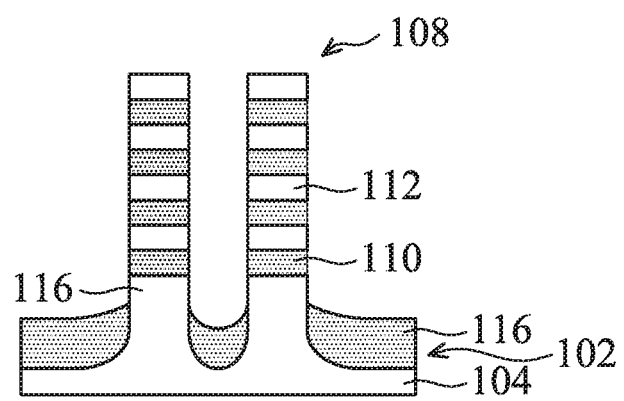
Figures 1, 1B:
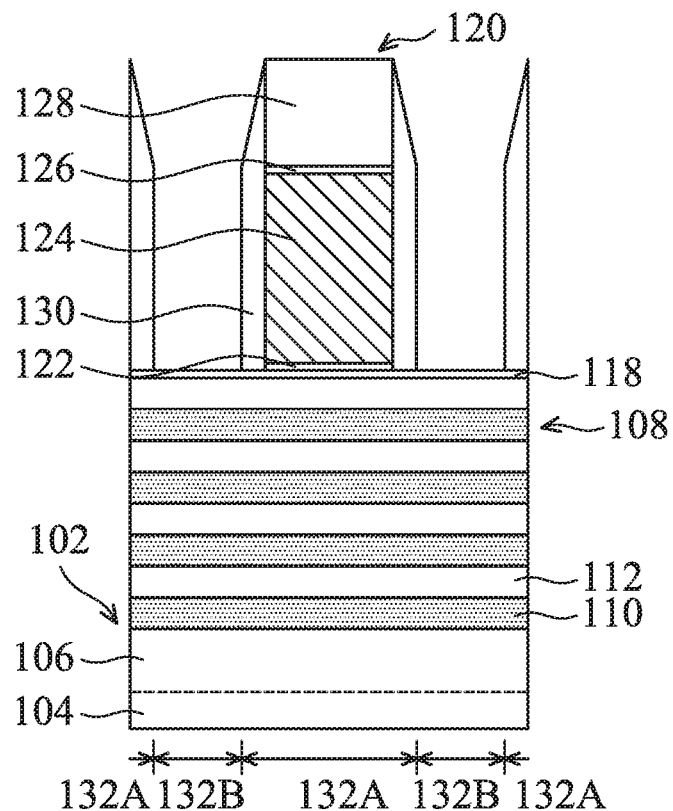
Figures 1, 1B, 2:
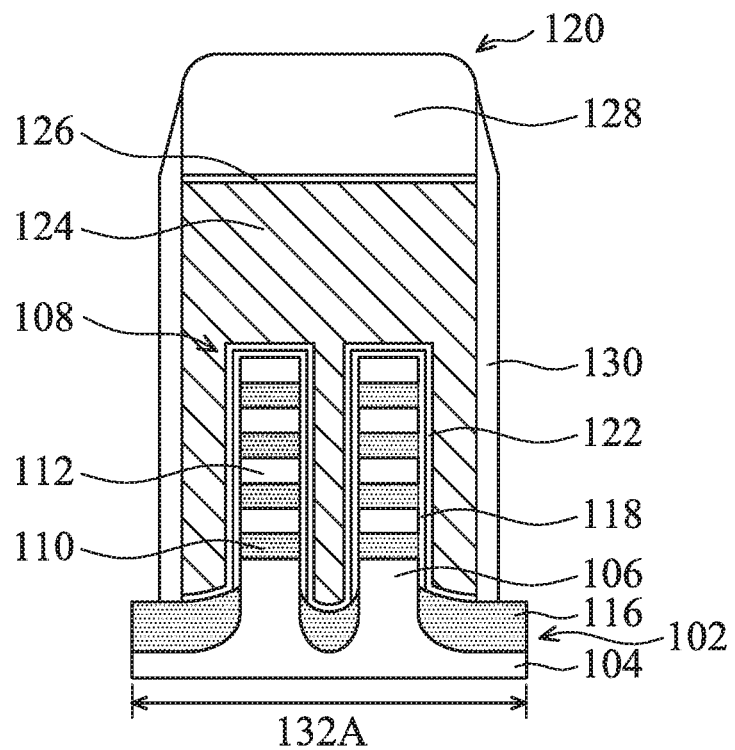
Figures 1, 1C:
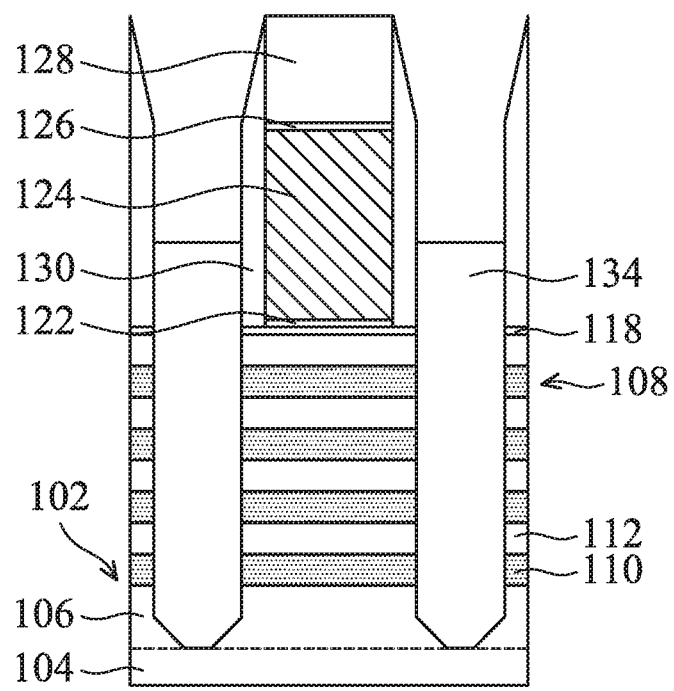
Figures 1, 1C, 2:
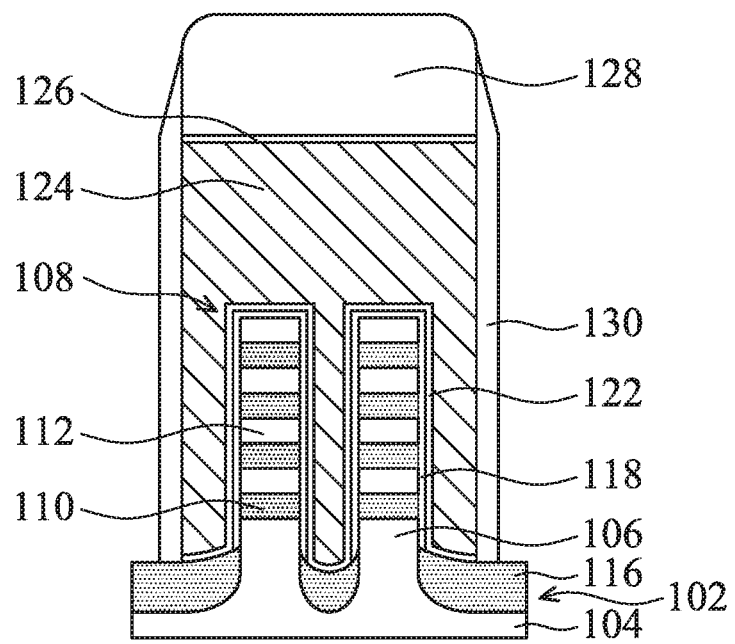
Figures 1, 1D:
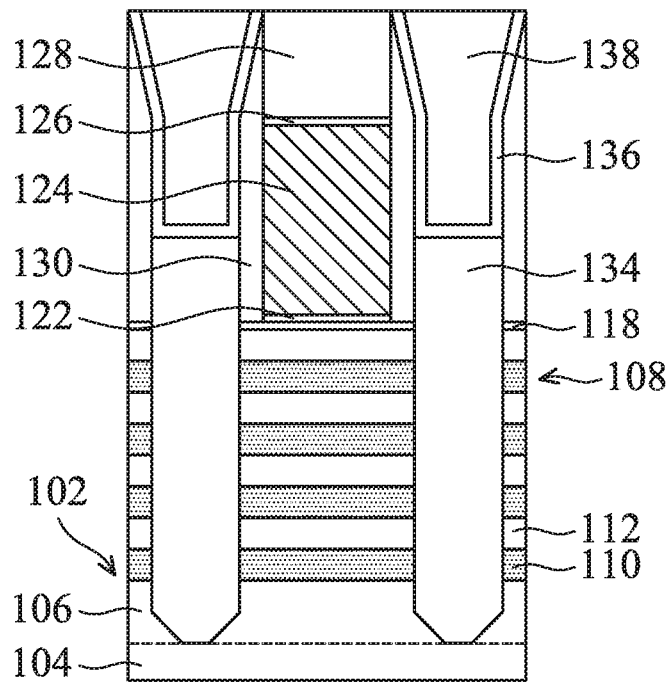
Figures 1, 1D, 2:
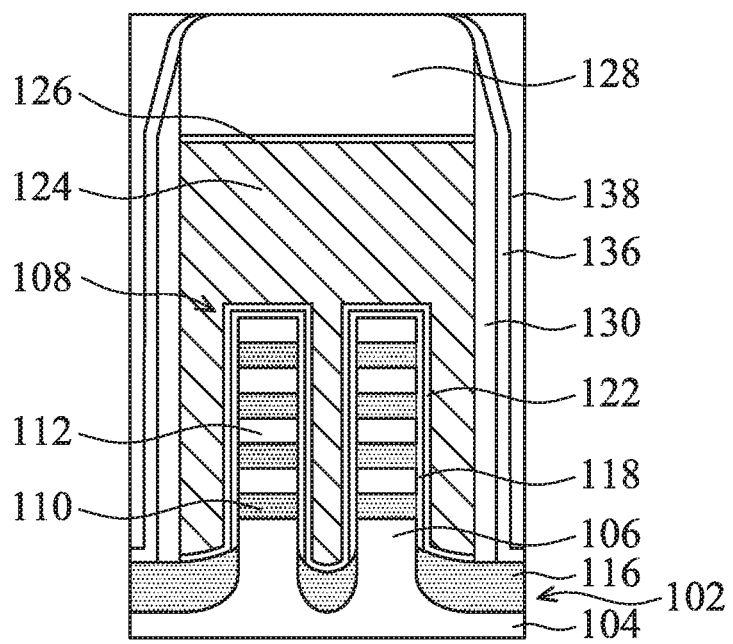
Figures 1, 1E:
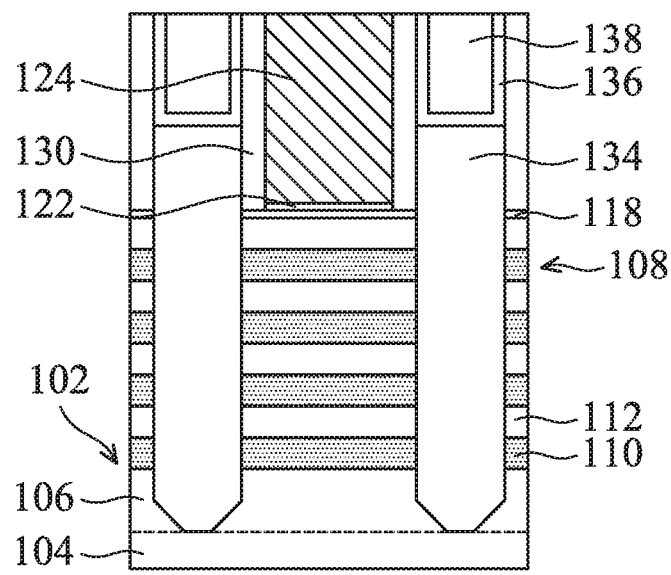
Figures 1, 1E, 2:
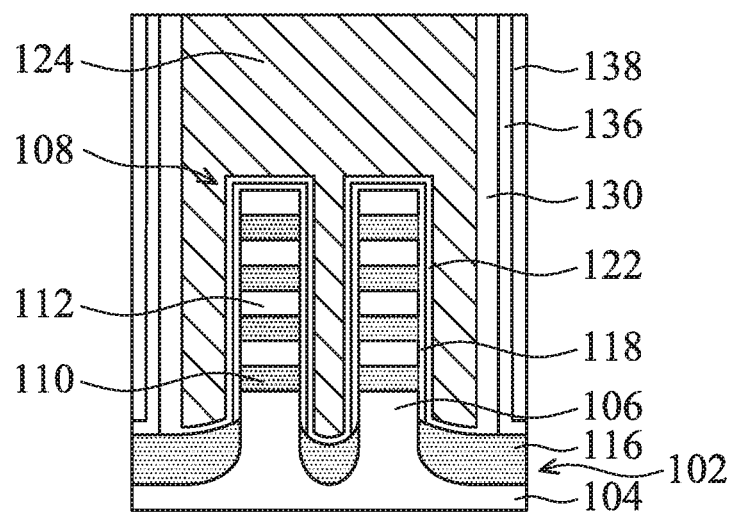
Figures 1, 1F:
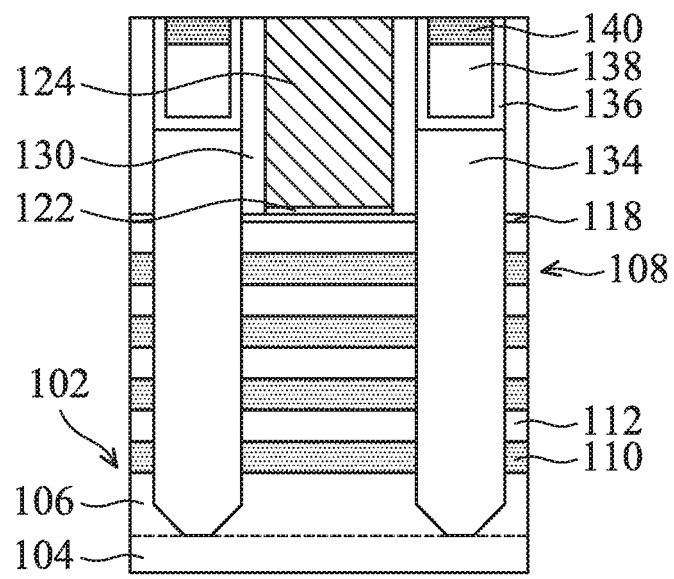
Figures 1, 1F, 2:
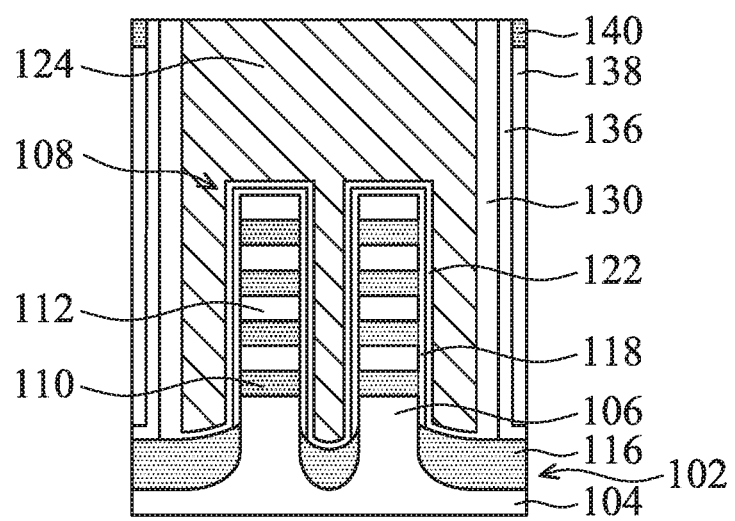
Figures 1, 1G:
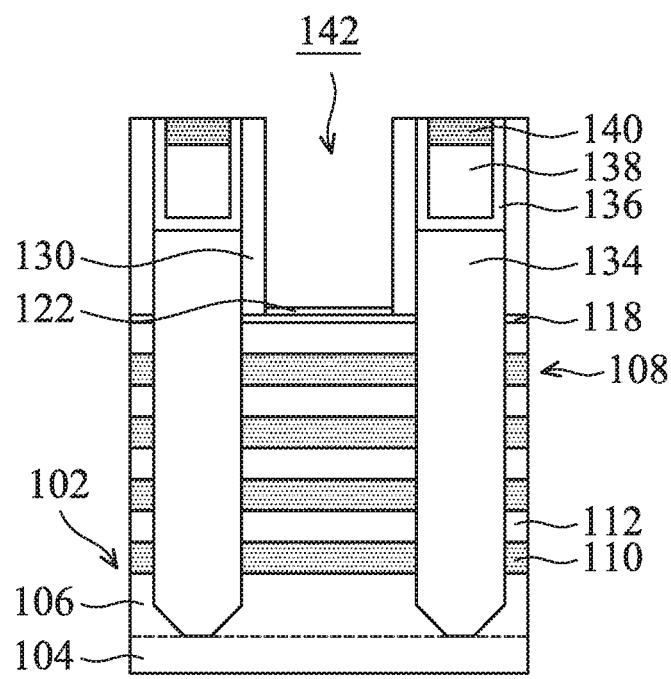
Figures 1, 1G, 2:
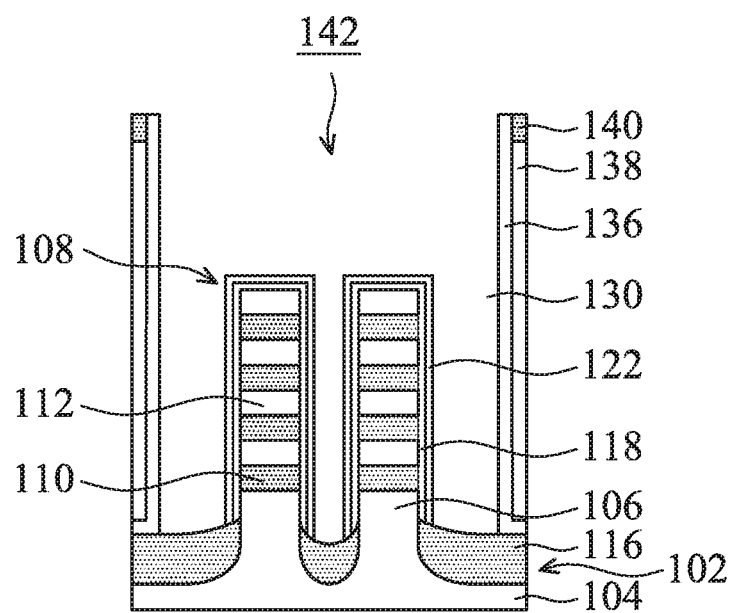

FIGS. 1A-1 to 1G-1, FIGS. 1A-2 to 1G-2 and FIGS. 4A to 4D are cross-sectional views of various stages of a process for forming a semiconductor device structure, in accordance with some embodiments. In some embodiments, FIGS. 1A-1 to 1G-1 are cross-sectional views along the direction A1 shown in FIG. 4A, and FIGS. 1A-2 to 1G-2 are cross-sectional views along the direction A2 shown in FIG. 4A. In some embodiments, the same relationship between these figures is applied to the following figures, and will not be repeated for the sake of brevity.

In some embodiments, the semiconductor device structure or the semiconductor substrate has an input-output region and a core region. In some embodiments, each of the input-output region and the core region has an N-type region and a P-type region. In some embodiments, the semiconductor device structure shown in FIGS. 1A-1 to 1G-1, FIGS. 1A-2 to 1G-2 and FIGS. 4A to 4D represents one or more semiconductor device structures positioned in the N-type region of the core region, in the P-type region of the core region, in the N-type region of the input-output region, and/or the P-type region of the input-output region. However, it should be noted that only one semiconductor device structure is shown in FIGS. 1A-1 to 1G-1, FIGS. 1A-2 to 1G-2 and FIGS. 4A to 4D for the sake of brevity.

As shown in FIGS. 1A-1, 1A-2 and 4A, a semiconductor substrate 102 is received or provided, in accordance with some embodiments. In some embodiments, the semiconductor substrate 102 has a base portion 104 and a fin portion 106 over the base portion 104.

In some embodiments, the semiconductor substrate 102 is a bulk semiconductor substrate, such as a semiconductor wafer. For example, the semiconductor substrate 102 is a silicon wafer. The semiconductor substrate 102 may include silicon or another elementary semiconductor material such as germanium. In some other embodiments, the semiconductor substrate 102 includes a compound semiconductor. The compound semiconductor may include gallium arsenide, silicon carbide, indium arsenide, indium phosphide, another suitable material, or a combination thereof.

In some embodiments, the semiconductor substrate 102 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 102 is an un-doped substrate. However, in some other embodiments, the semiconductor substrate 102 is a doped substrate such as a P-type substrate or an N-type substrate.

In some embodiments, the semiconductor substrate 102 includes various doped regions (not shown) depending on design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

Still referring to FIGS. 1A-1, 1A-2 and 4A, a stack structure 108 is formed over the fin portion 106, in accordance with some embodiments. As shown in FIGS. 1A-1, 1A-2 and 4A, the stack structure 108 includes one or more of the semiconductor layers 110 and one or more of the semiconductor layers 112 alternately stacked vertically over the fin portion 106, in accordance with some embodiments. Although the stack structure 108 shown in FIGS. 1A-1, 1A-2 and 4A includes four semiconductor layers 110 and four semiconductor layers 112, the embodiments of the present disclosure are not limited thereto. In some other embodiments, the stack structure 108 includes one semiconductor layer 110 and one semiconductor layer 112 vertically stacked over the fin portion 106.

In some embodiments, the semiconductor layer 110 and the semiconductor layer 112 are independently made of silicon, silicon germanium, germanium tin, silicon germanium tin, gallium arsenide, indium gallium arsenide, indium arsenide, another suitable material, or a combination thereof. In some embodiments, the material of semiconductor layer 110 is different from the material of semiconductor layer 112. In some embodiments, the semiconductor layer 110 is made of silicon germanium, whereas the semiconductor layer 112 is made of silicon, and the semiconductor substrate 102 is made of silicon. In some embodiments, the semiconductor layer 110 is made of indium gallium arsenide, whereas the semiconductor layer 112 is made of gallium arsenide, and the semiconductor substrate 102 is made of gallium arsenide.

In some embodiments, a semiconductor substrate without a fin portion is provided. Afterwards, in some embodiments, one or more of the first semiconductor material layers and one or more of the second semiconductor material layers are alternately stacked vertically over the semiconductor substrate.

In some embodiments, the first semiconductor material layers and the second semiconductor material layers are formed using an epitaxial growth process. Each of the first semiconductor material layers and the second semiconductor material layers may be formed using a selective epitaxial growth (SEG) process, a chemical vapor deposition (CVD) process (e.g., a vapor-phase epitaxy (VPE) process, a low-pressure CVD (LPCVD) process, and/or an ultra-high vacuum CVD (UHV-CVD) process), a molecular beam epitaxy process, another applicable process, or a combination thereof. In some embodiments, the first semiconductor material layers and the second semiconductor material layers are grown in-situ in the same process chamber.

As shown in FIGS. 1A-1, 1A-2, and 4A, multiple recesses (or trenches) 114 are formed to pattern the first semiconductor material layers, the second semiconductor material layers, and the upper portion of the semiconductor substrate, in accordance with some embodiments. In some embodiments, multiple photolithography processes and etching processes are performed to form the recesses 114. The recess 114 may be used to separate two neighboring field effect transistors (FETs). As a result, the patterned semiconductor substrate 102 includes the fin portion 106 between two recesses 114. As a result, the patterned first semiconductor material layers and the second semiconductor material layers form the semiconductor layers 110 and the semiconductor layers 112 respectively. In some embodiments, the semiconductor layers 110 and the semiconductor layers 112 form the stack structure 108. FIG. 1A-2 shows two fin portions 106, whereas FIG. 4A only shows one of these fin portions 106 for the sake of brevity.

In some embodiments, the thickness of the semiconductor layer 110 is substantially equal to the thickness of the semiconductor layer 112.

As shown in FIGS. 1A-1, 1A-2, and 4A, one or more isolation structures including an isolation structure 116 are formed over the semiconductor substrate 102 and formed in the recesses 114 to surround lower portions of the fin portion 106, in accordance with some embodiments. The isolation structure 116 is adjacent to the fin portion 106. In some embodiments, the isolation structure 116 continuously surrounds the lower portions of the fin portion 106. The upper portion of the fin portion 106 protrudes from the top surfaces of the isolation features 116.

The isolation structure 116 is used to define and electrically isolate various device elements formed in and/or over the semiconductor substrate 102. In some embodiments, the isolation structure 116 includes a shallow trench isolation (STI) feature, a local oxidation of silicon (LOCOS) feature, another suitable isolation structure, or a combination thereof.

In some embodiments, the isolation structure 116 has a multi-layer structure. In some embodiments, the isolation structure 116 is made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 102 and the isolation structure 116. The STI liner may also be used to reduce crystalline defects at the interface between the fin portions 106 and the isolation structure 116.

In some embodiments, a dielectric layer is deposited to cover the semiconductor substrate 102 and the stack structure 108 using a chemical vapor deposition (CVD) process, a spin-on process, another applicable process, or a combination thereof. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method. The dielectric layer covers the fin portion 106 and fills the recesses 114 between the fin portions 106.

Afterwards, in some embodiments, a planarization process is performed to thin down the dielectric layer. For example, the dielectric layer is thinned until the stack structure 108 is exposed. The planarization process may include a chemical mechanical polishing (CMP) process, a grinding process, a dry polishing process, an etching process, another applicable process, or a combination thereof. Afterwards, the dielectric layer is etched back to be below the top of the stack structure 108 and the top of the fin portion 106. As a result, the isolation structure 116 is formed. The fin portion 106 protrudes from the top surface of the isolation structure 116, as shown in FIGS. 1A-1, 1A-2, and 4A in accordance with some embodiments.

Afterwards, as shown in FIGS. 1B-1, 1B-2 and 4B, a protective layer 118 is formed to cover the stack structure 108, in accordance with some embodiments. In some embodiments, the protective layer 118 is made of silicon, silicon germanium, oxide material such as silicon oxide, nitride material such as silicon nitride, sulfide material such as silicon sulfide, another suitable material, or a combination thereof.

In some embodiments, the applicable deposition methods for depositing the protective layer 118 include a chemical vapor deposition (CVD) process, an atomic layer deposition (ALD) process, a thermal oxidation process, a nitridation process, a sulfidation process, a spin-on coating process, other applicable processes, and combinations thereof.

Embodiments of the disclosure have many variations and are not limited to the embodiments mentioned above. In some other embodiments, the protective layer 118 is not formed.

As shown in FIGS. 1B-1, 1B-2 and 4B, one or more dummy gate structures are formed over the semiconductor substrate 102 and the stack structure 108, in accordance with some embodiments. To simplify the diagram, only one dummy gate structure 120 is depicted. The semiconductor device structure may include more dummy gate structures.

In some embodiments, the dummy gate structure 120 is formed over the stack structure 108.

As shown in FIGS. 1B-1, 1B-2 and 4B, the dummy gate structure 120 includes a dummy gate dielectric layer 122 over the stack structure 108, a dummy gate electrode 124 over the dummy gate dielectric layer 122, a mask element 126 over the dummy gate electrode 124, and a mask element 128 over the mask element 126, in accordance with some embodiments.

In some embodiments, the dummy gate dielectric layer 122 is made of silicon oxide, silicon nitride, silicon oxynitride, the high-k material, another suitable dielectric material, or a combination thereof. In some embodiments, the high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$ (BST), $Al_2O_3$, another suitable high-k dielectric material, or a combination thereof.

In some embodiments, the dummy gate electrode 124 is made of polysilicon, a metal material, another suitable conductive material, or a combination thereof. In some embodiments, the metal material may include, but is not limited to, copper, aluminum, tungsten, molybdenum, titanium, tantalum, platinum, or hafnium. In some embodiments, the dummy gate electrode 124 will be replaced with another conductive material such as a metal material in subsequent processes.

In some embodiments, the mask element 126 is made of silicon nitride or another suitable material. In some embodiments, the mask element 128 is made of silicon oxide or another suitable material.

In some embodiments, a gate dielectric material layer (not shown) and a gate electrode material layer (not shown) are sequentially deposited over the semiconductor substrate 102 and the stack structure 108. In some embodiments, the gate dielectric material layer and the gate electrode material layer are sequentially deposited by using applicable deposition methods. In some embodiments, the applicable deposition methods for depositing the gate dielectric material layer include a chemical vapor deposition (CVD) process, an atomic layer deposition (ALD) process, a thermal oxidation process, a spin-on coating process, other applicable processes, and combinations thereof. In some embodiments, the applicable deposition methods for depositing the gate electrode material layer include a chemical vapor deposition (CVD) process, a physical vapor deposition (PVD) process, and other applicable methods.

Afterwards, according to some embodiments of the present disclosure, a first mask material layer is deposited over the gate electrode material layer, and a second mask material layer is deposited over the first material layer. In some embodiments, the first mask material layer is made of silicon nitride or another suitable material. In some embodiments, the second mask material layer is made of silicon oxide or another suitable material.

Afterwards, according to some embodiments of the present disclosure, one or more etching process is performed to pattern the second mask material layer and the first mask material layer. In some embodiments, the patterned second mask material layer forms the mask element 128, and the patterned first mask material layer forms the mask element 126.

Afterwards, according to some embodiments of the present disclosure, by using the mask element 126 and the mask element 128 as masks, the gate dielectric material layer and the gate electrode material layer are patterned to form the dummy gate dielectric layer 122 and the dummy gate electrode 124.

In some embodiments, the dummy gate dielectric layer 122 has a thickness less than the thickness of the subsequently formed input-output gate dielectric layer (IO gate dielectric layer). In some embodiments, since the dummy gate dielectric layer 122, rather than an input-output gate dielectric layer, is deposited in this stage, the process window for depositing the dummy gate electrode 124 is enlarged. For example, as shown in FIG. 1B-2, the dummy gate electrode 124 may well filled into the space between two stack structures 108 and between two fin portions 106. The formation of void in the space between two stack structures 108 and between two fin portions 106 is reduced or prevented. Therefore, the manufacturing yield may be improved, and the structural reliability of the semiconductor device structure is also improved.

As shown in FIGS. 1B-1, 1B-2 and 4B, spacer elements 130 are formed over sidewalls of the dummy gate structure 120, in accordance with some embodiments. In some embodiments, the spacer elements 130 are made of silicon nitride, silicon oxynitride, silicon carbide, another suitable material, or a combination thereof.

In some embodiments, a spacer layer is deposited over the semiconductor substrate 102, the stack structure 108, the protective layer 118 and the dummy gate structure 120. The spacer layer may be deposited using a CVD process, a PVD process, a spin-on coating process, another applicable process, or a combination thereof. Afterwards, an etching process, such as an anisotropic etching process, is performed to partially remove the spacer layer. As a result, the remaining portions of the spacer layer over the sidewalls of the dummy gate structure 120 form the spacer elements 130.

As shown in FIGS. 1B-1, 1B-2 and 4B, the fin portion 106 has a channel region 132A and a source/drain region 132B, in accordance with some embodiments. As shown in FIGS. 1B-1 and 1B-2, the region of the fin portion 106 covered by the dummy gate structure 120 and the spacer elements 130 is the channel region 132A, in accordance with some embodiments. As shown in FIG. 1B-1, the region of the fin portion 106 exposed by the dummy gate structure 120 and the spacer elements 130 is the source/drain region 132B, in accordance with some embodiments.

As shown in FIGS. 1C-1, 1C-2 and 4C, source/drain portions 134 are respectively formed in the stack structure 108 and the fin portions 106 at the source/drain region 132B, in accordance with some embodiments.

In some embodiments, portions of the stack structure 108 and the fin portions 106 are removed to form recesses adjacent to the opposite sides of the dummy gate structure 120. In some embodiments, a photolithography process and an etching process are performed to form the recesses.

Afterwards, in some embodiments, a semiconductor material is epitaxially grown in the recesses and continues to grow to above the recesses to form the source/drain portions 134.

In some embodiments, the source/drain portions 134 may alternatively be referred to as raised source and drain features. In some embodiments, the source/drain portions 134 are strained structures. The source/drain portions 134 impart stress or strain to the channel region 132A under the dummy gate structure 120 to enhance the carrier mobility in the subsequently formed nanowire of the device and improve device performance.

In some embodiments, the source/drain portions 134 are an n-type semiconductor material. The source/drain portions 134 may include epitaxially grown silicon, epitaxially grown silicon phosphide (SiP), or another applicable epitaxially grown semiconductor material. The source/drain portions 134 are not limited to being an n-type semiconductor material. In some other embodiments, the source/drain portions 134 are made of a p-type semiconductor material. For example, the source/drain portions 134 may include epitaxially grown silicon germanium.

In some embodiments, the source/drain portions 134 are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the source/drain portions 134 may use gaseous and/or liquid precursors, which may interact with the composition of the stack structure 108 and the fin portions 106 thereunder.

In some embodiments, the source/drain portions 134 are doped with one or more suitable dopants. For example, the source/drain portions 134 are Si source/drain features doped with phosphor (P), antimony (Sb), or another suitable dopant. Alternatively, the source/drain portions 134 are SiGe source/drain features doped with boron (B) or another suitable dopant.

In some embodiments, the source/drain portions 134 are doped in-situ during the growth of the source/drain portions 134. In some other embodiments, the source/drain portions 134 are not doped during the growth of the source/drain portions 134. After the formation of the source/drain portions 134, the source/drain portions 134 are doped in a subsequent process. In some embodiments, the doping is achieved by using an ion implantation process, a plasma immersion ion implantation process, a gas and/or solid source diffusion process, another applicable process, or a combination thereof.

Embodiments of the disclosure have many variations and are not limited to the embodiments mentioned above. In some other embodiments, the source/drain portions 134 may have other configurations. In some other embodiments, the source/drain portions 134 are doped regions in the stack structure 108 and the fin portions 106.

Figure 4A:
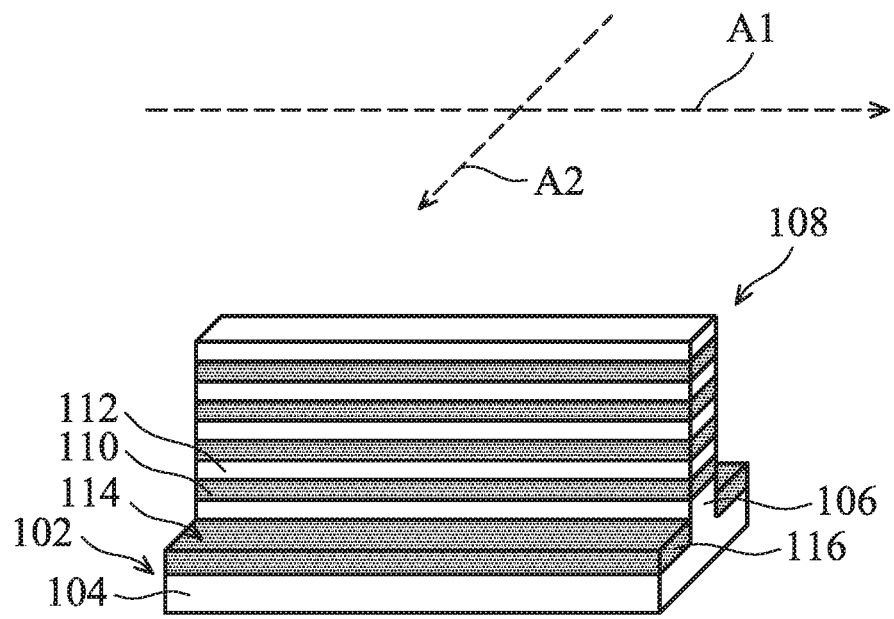
FIGS. 4A to 4H are perspective views of various stages of a process for forming a semiconductor device structure, in accordance with some embodiments.
Figure 4B:
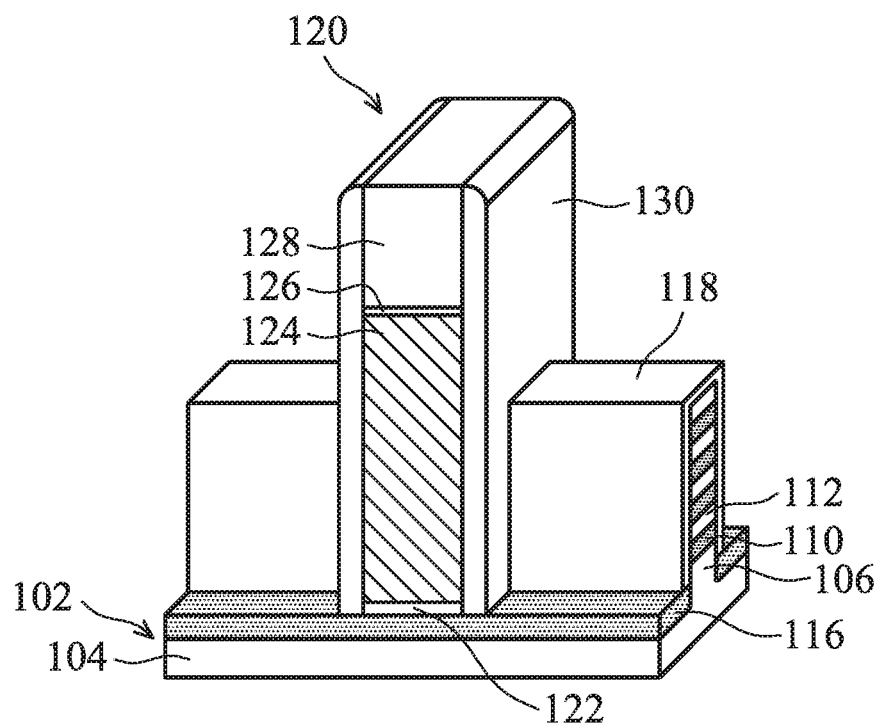
Figure 4C:
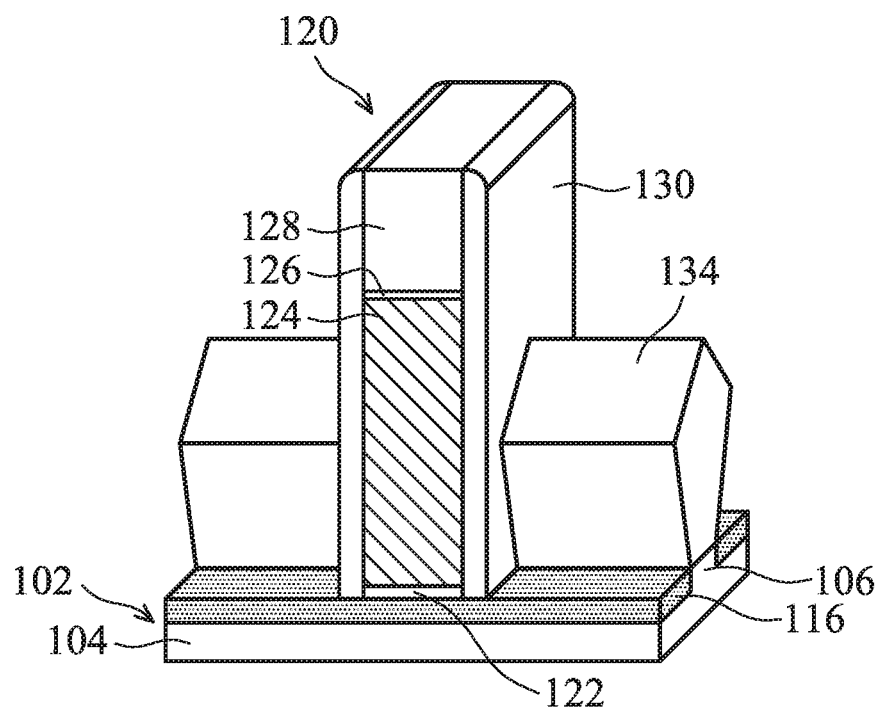
Figure 4D:
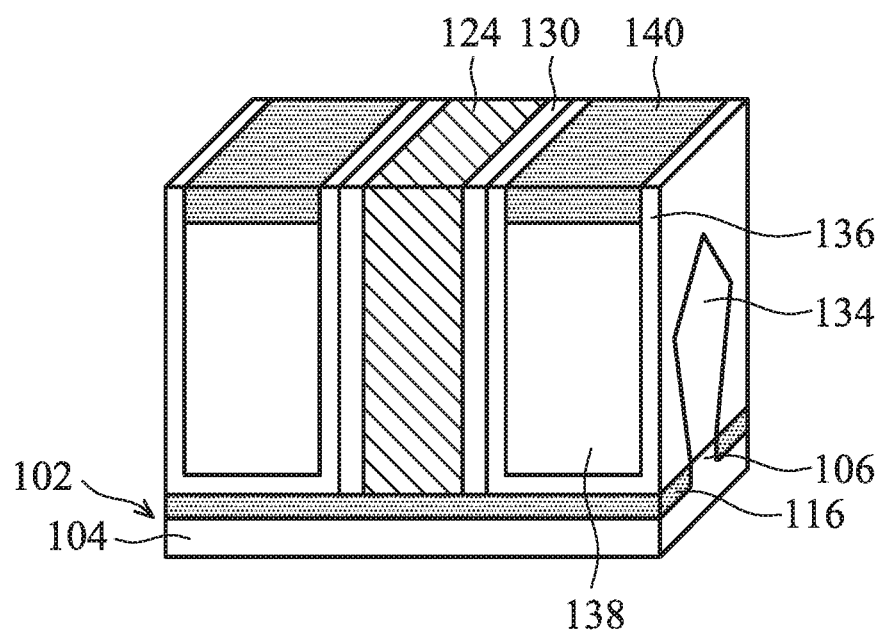

It should be noted that, FIG. 4C only depicts the portion of the structure between the two source/drain portions 134 shown in FIG. 1C-1. The left most spacer element 130 and the right most spacer element 130 in FIG. 1C-1 are not depicted in FIG. 4C in order to clearly describe the embodiments of the present disclosure.

Afterwards, as shown in FIGS. 1D-1 and 1D-2, an etch stop layer 136 is conformally deposited over the top surfaces of the source/drain portions 134 and the isolation structure 116, and deposited over the sidewall of the spacer elements 130, in accordance with some embodiments.

In some embodiments, the etch stop layer 136 is made of silicon nitride, silicon oxynitride, silicon carbide, another suitable material, or a combination thereof. In some embodiments, the applicable deposition methods for depositing the etch stop layer 136 includes a chemical vapor deposition (CVD) process, an atomic layer deposition (ALD) process, a spin-on coating process, other applicable processes, and combinations thereof.

Afterwards, as shown in FIGS. 1D-1 and 1D-2, an interlayer dielectric layer 138 is subsequently formed over the etch stop layer 136, in accordance with some embodiments. In some embodiments, the interlayer dielectric layer 138 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the interlayer dielectric layer 138 is deposited using a CVD process, an ALD process, a spin-on process, a spray coating process, another applicable process, or a combination thereof.

Afterwards, as shown in FIGS. 1E-1 and 1E-2, one or more planarization processes are used to thin down and remove the mask element 128 and the mask element 126, in accordance with some embodiments. As shown in FIGS. 1E-1 and 1E-2, the planarization processes also thin down and partially remove the etch stop layer 136 and the interlayer dielectric layer 138, in accordance with some embodiments. The etch stop layer 136 and the interlayer dielectric layer 138 may be partially removed until the dummy gate electrode 124 is exposed. In some embodiments, examples of the planarization process include a CMP process, a grinding process, a dry polishing process, an etching process, other applicable processes, and combinations thereof.

In some embodiments, a first planarization process is performed to remove the mask element 128 and partially remove the etch stop layer 136 and the interlayer dielectric layer 138 until the mask element 126 is exposed. Afterwards, in some embodiments, a second planarization process is performed to remove the mask element 126 and partially remove the etch stop layer 136 and the interlayer dielectric layer 138 until the dummy gate electrode 124 is exposed.

Afterwards, as shown in FIGS. 1F-1, 1F-2 and 4D, a protective element 140 is formed over the etched interlayer dielectric layer 138 and between two sidewalls of the etch stop layer 136, in accordance with some embodiments. In some embodiments, the protective element 140 is made of silicon nitride, silicon oxynitride, silicon carbide, another suitable material, or a combination thereof. In some embodiments, the material of the protective element 140 is different from the material of the interlayer dielectric layer 138.

In some embodiments, the interlayer dielectric layer 138 is partially removed to form recesses (or trenches) between two sidewalls of the etch stop layer 136. A photolithography process and an etching process may be used to form the recesses. In some embodiments, a protective material layer is deposited over the dummy gate electrode 124, the spacer elements 130, the etch stop layer 136, the interlayer dielectric layer 138 and is filled into the recesses. In some embodiments, the protective material layer is made of silicon nitride, silicon oxynitride, silicon carbide, another suitable material, or a combination thereof.

Afterwards, a planarization process may be used to thin down and partially remove the protective material layer. The protective material layer may be partially removed until the dummy gate electrode 124 is exposed. As a result, the protective element 140 is formed. In some embodiments, the planarization process is a CMP process, a grinding process, a dry polishing process, an etching process, another applicable process, or a combination thereof.

In some embodiments, the protective element 140 protects the interlayer dielectric layer 138 from being damaged in the subsequent process which etches one of the semiconductor layers 110 and the semiconductor layers 112 to form semiconductor nanowires. In addition, in some embodiments, the protective element 140 also protects the interlayer dielectric layer 138 from being damaged in the subsequent clean process performed before forming a protective layer surrounding the semiconductor nanowires. Therefore, the protective element 140 may improve the manufacturing yield and improve structural stability.

Afterwards, as shown in FIGS. 1G-1 and 1G-2, the dummy gate electrode 124 is removed to form an opening 142, in accordance with some embodiments. In some embodiments, the dummy gate electrode 124 is removed using a wet etching process. For example, an etching solution containing $NH_4OH$ solution, dilute-HF, another suitable etching solution, or a combination thereof may be used. In some embodiments, the dummy gate electrode 124 is removed using a dry etching process. Example etchants include fluorine and/or chlorine based etchants.

In some embodiments, the semiconductor device structure shown in FIGS. 1G-1 and 1G-2 represents one or more semiconductor device structures positioned in the N-type region of the core region, in the P-type region of the core region, in the N-type region of the input-output region, and/or the P-type region of the input-output region.

Figures 1, 2A:
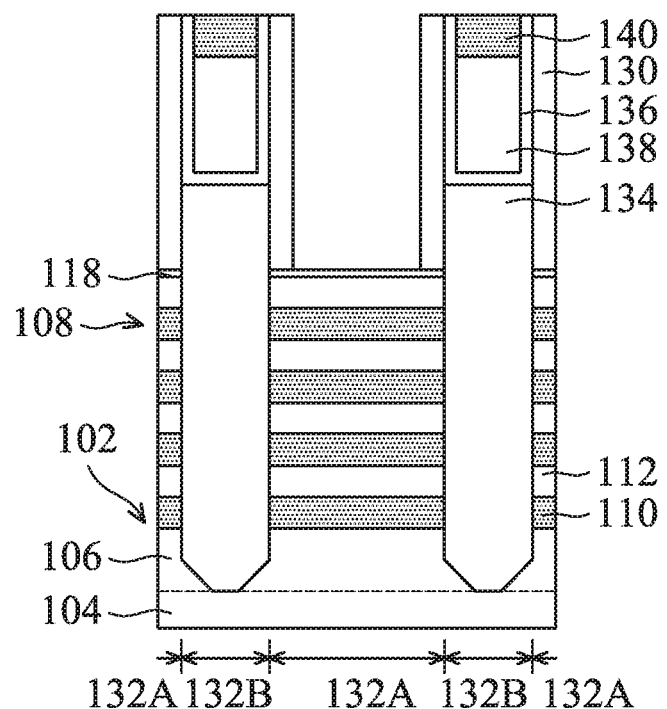
Figures 2, 2A:
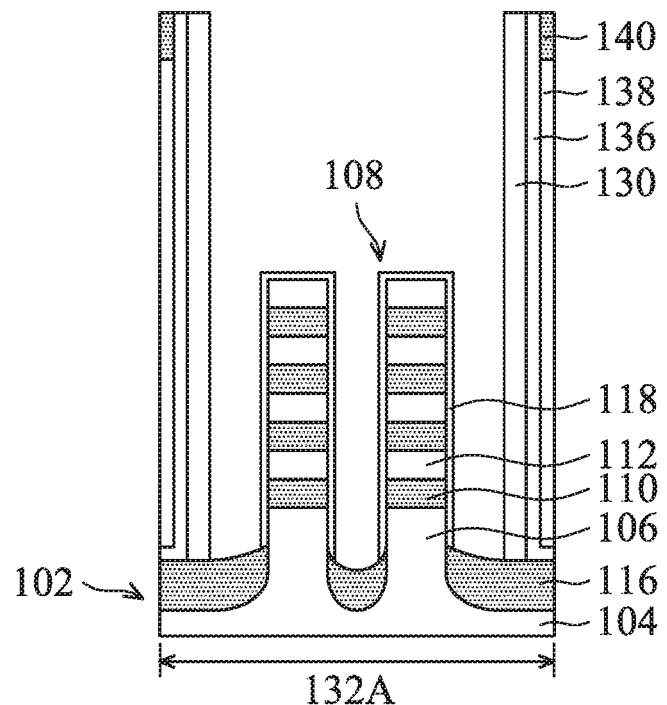
Figures 1, 2B:
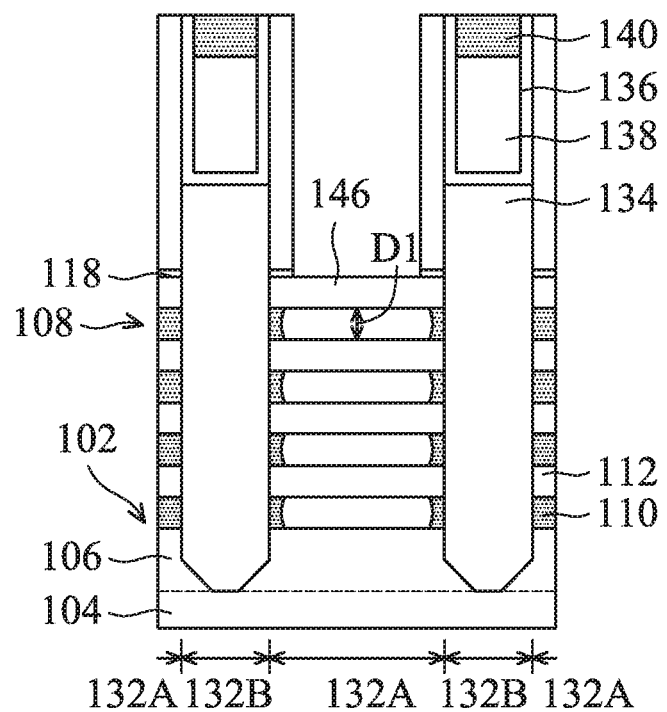
Figures 2, 2B:
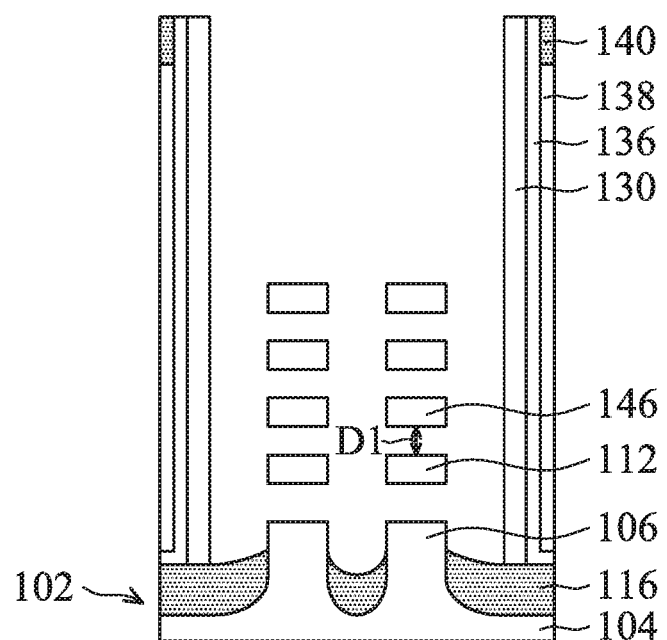
Figures 1, 2C:
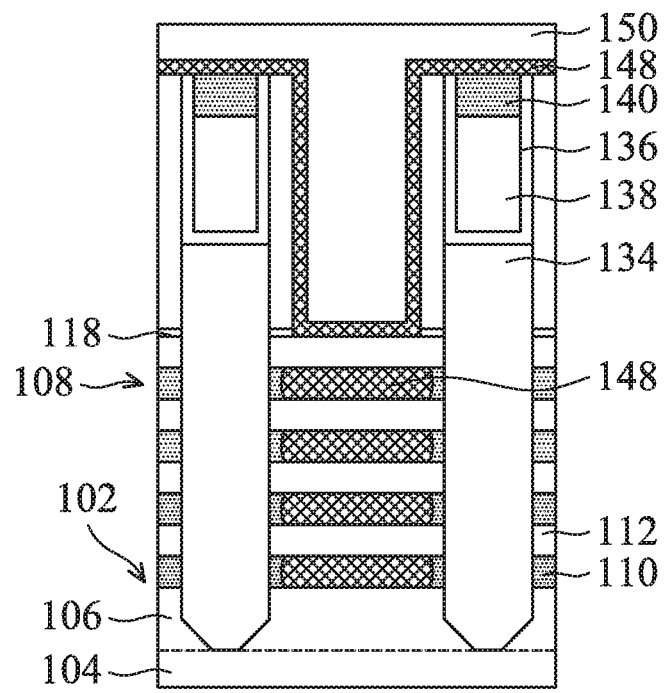
Figures 2, 2C:
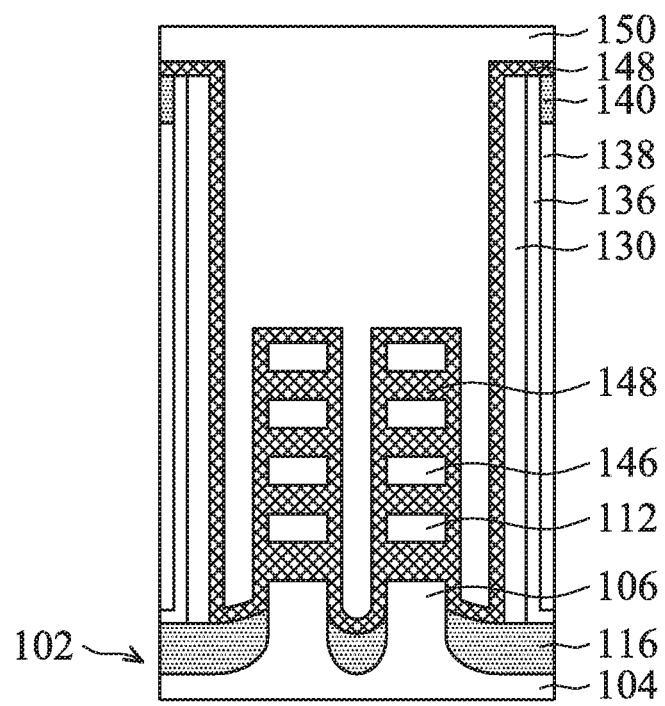
Figures 1, 2D:
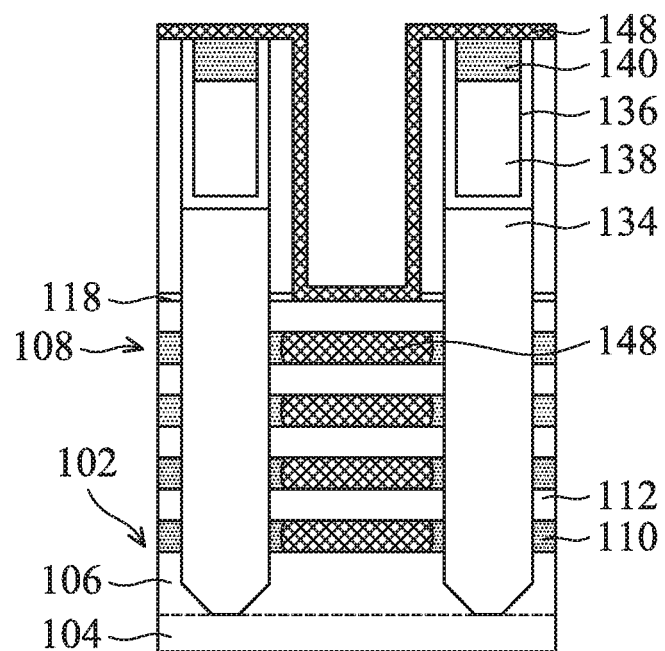
Figures 2, 2D:
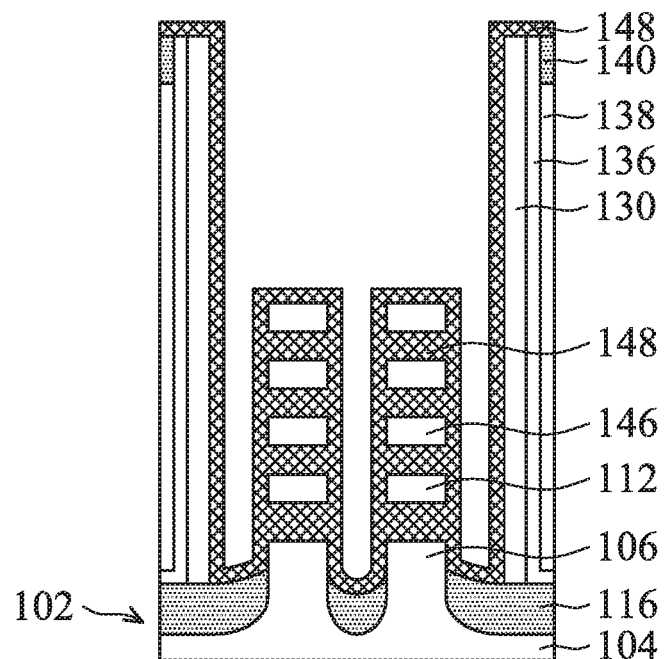
Figures 1, 2E:
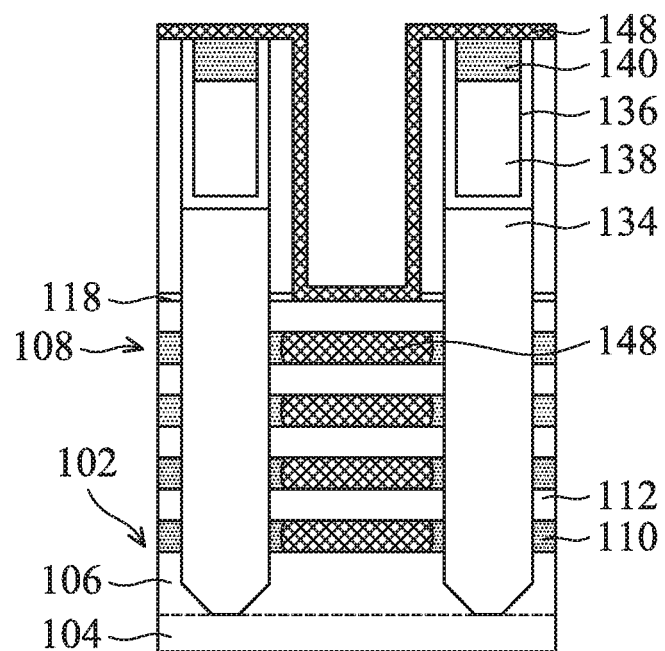
Figures 2, 2E:
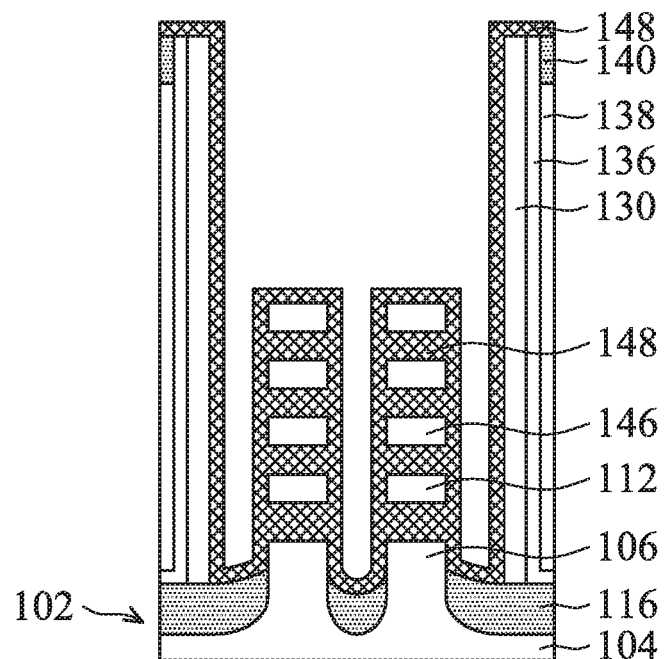
Figures 1, 2F:
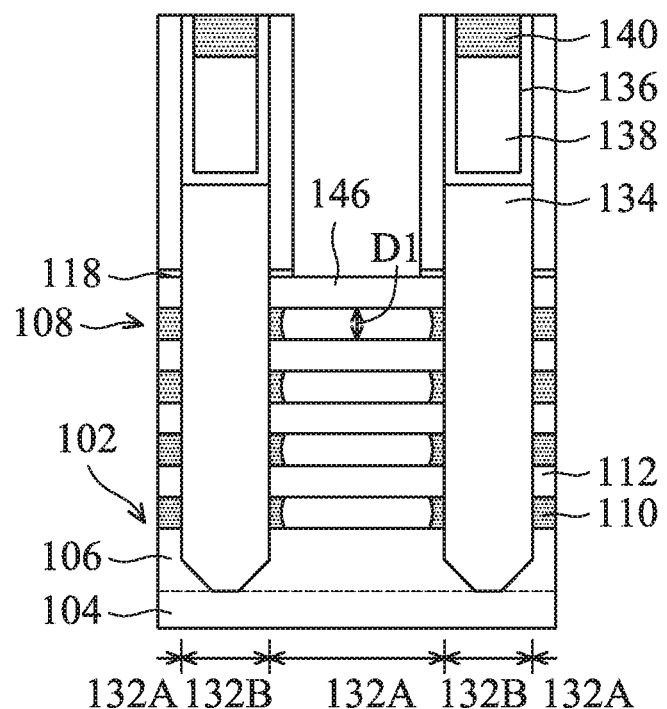
Figures 2, 2F:
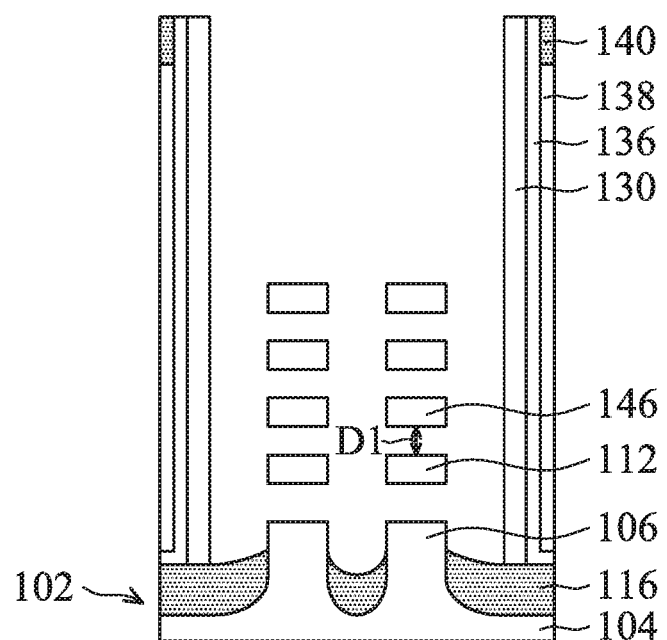
Figures 1, 2G:
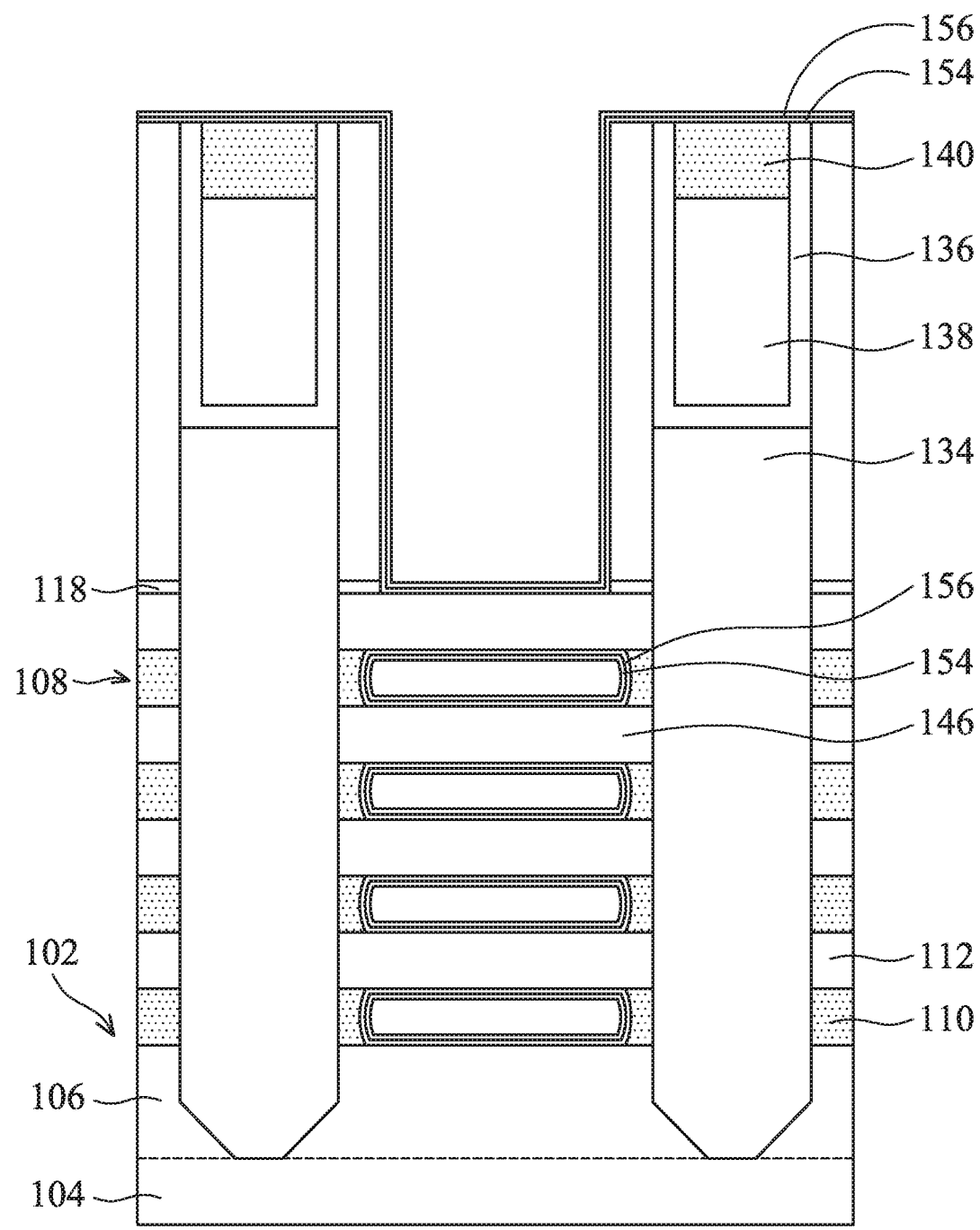
Figures 2, 2G:
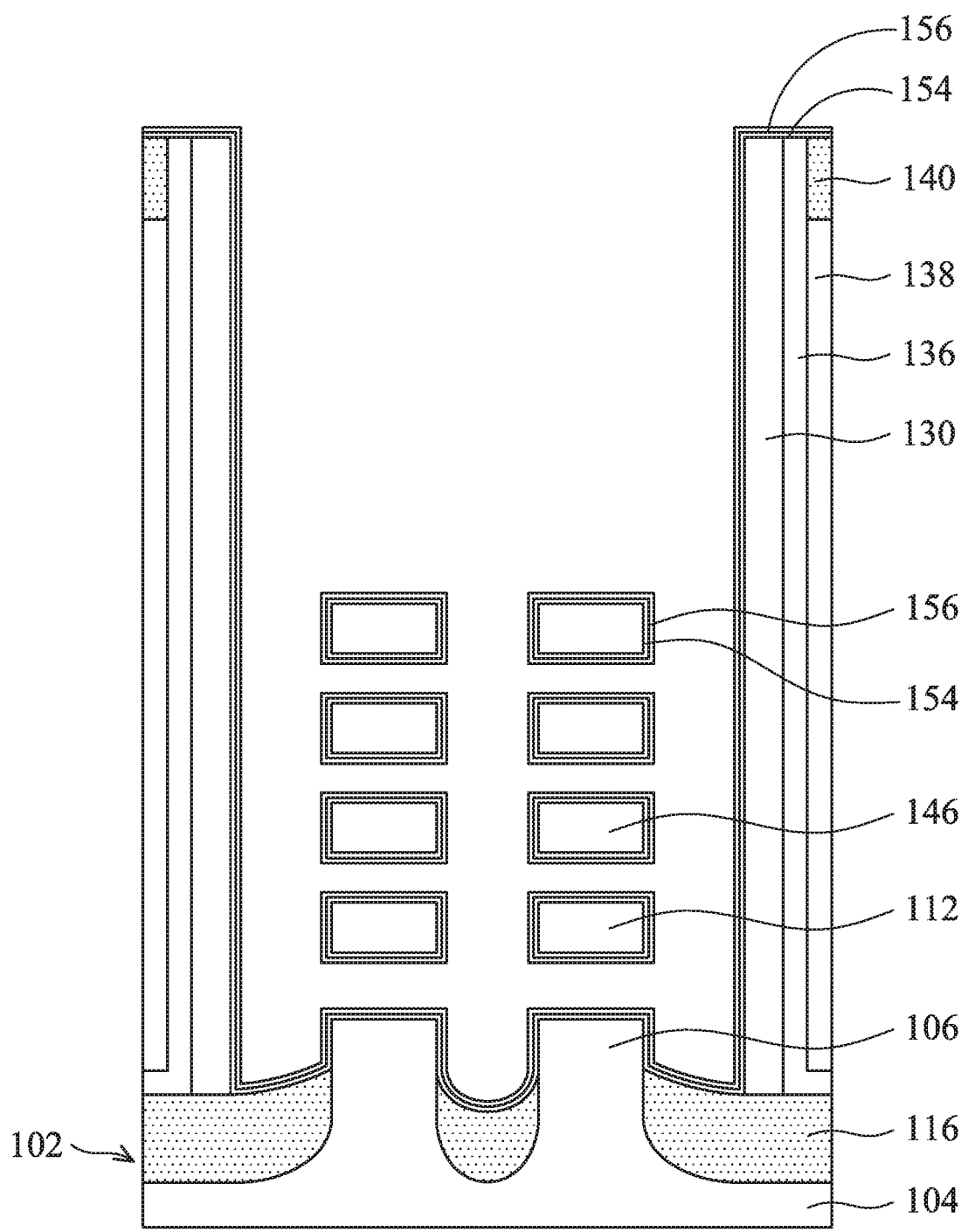
Figures 1, 2H:
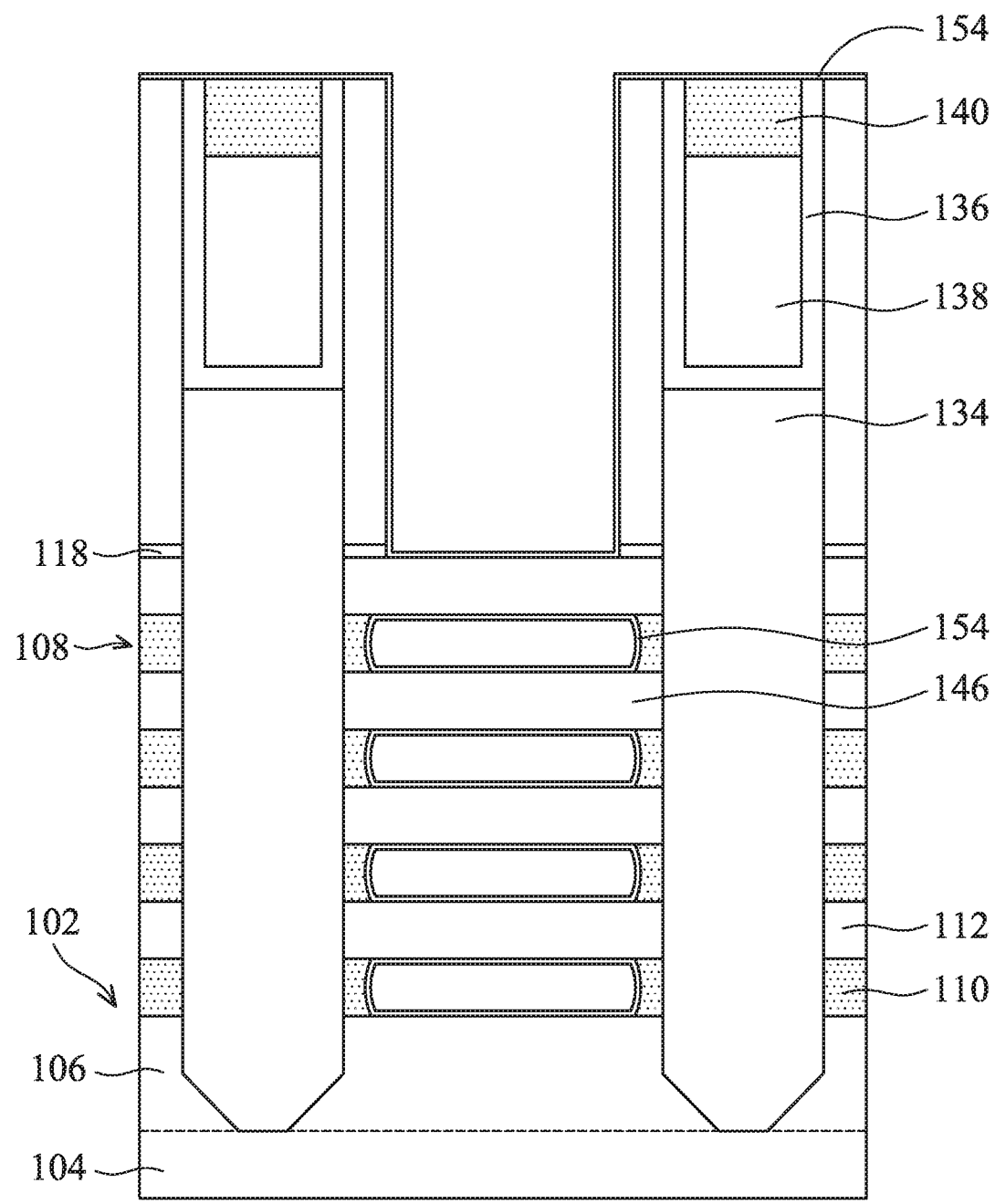
Figures 2, 2H:
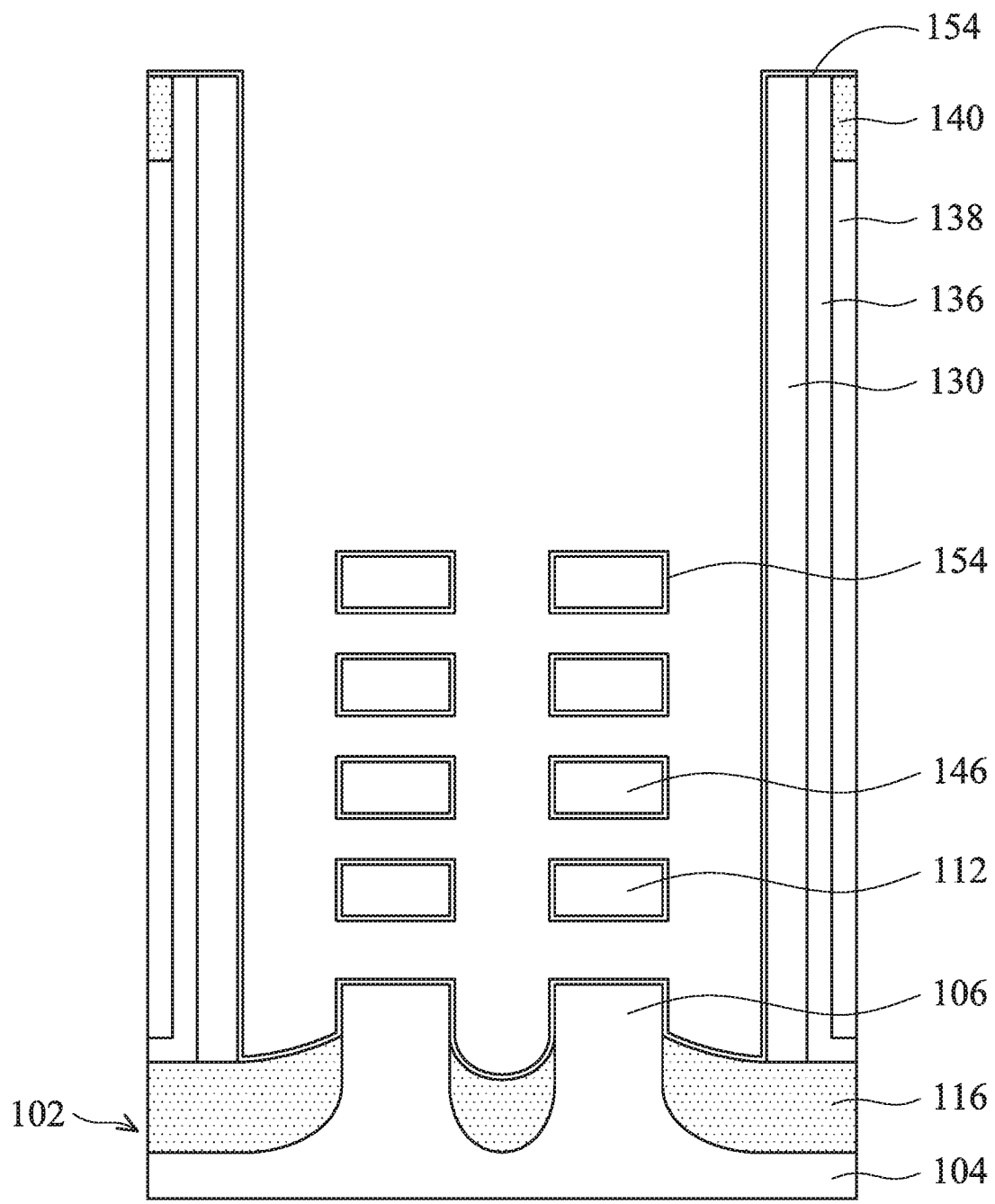

FIGS. 2A-1 to 2G-1 represent one or more semiconductor device structures positioned in the N-type region of the core region and the N-type region of the input-output region along the direction A1 shown in FIG. 4A. FIGS. 2A-2 to 2G-2 represent one or more semiconductor device structures positioned in the N-type region of the core region and the N-type region of the input-output region along the direction A2 shown in FIG. 4A.

Figures 1, 3A:
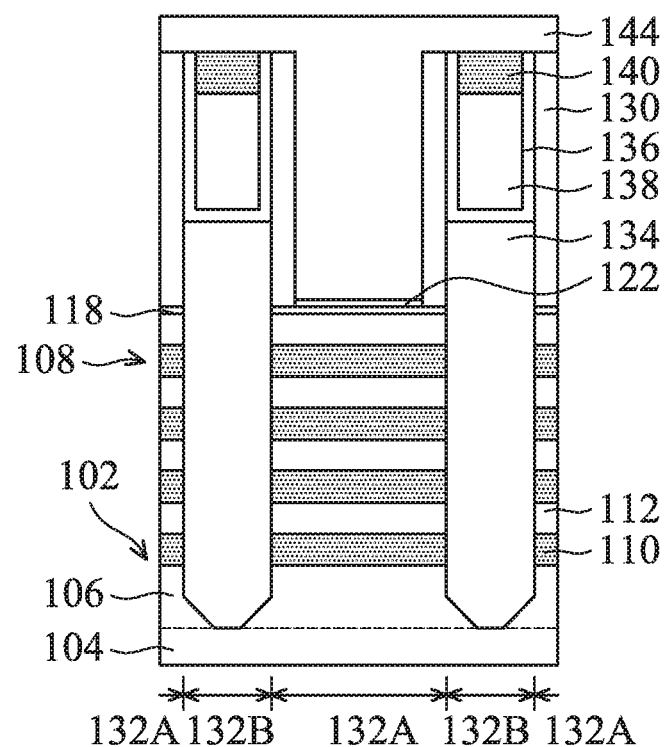
Figures 2, 3A:
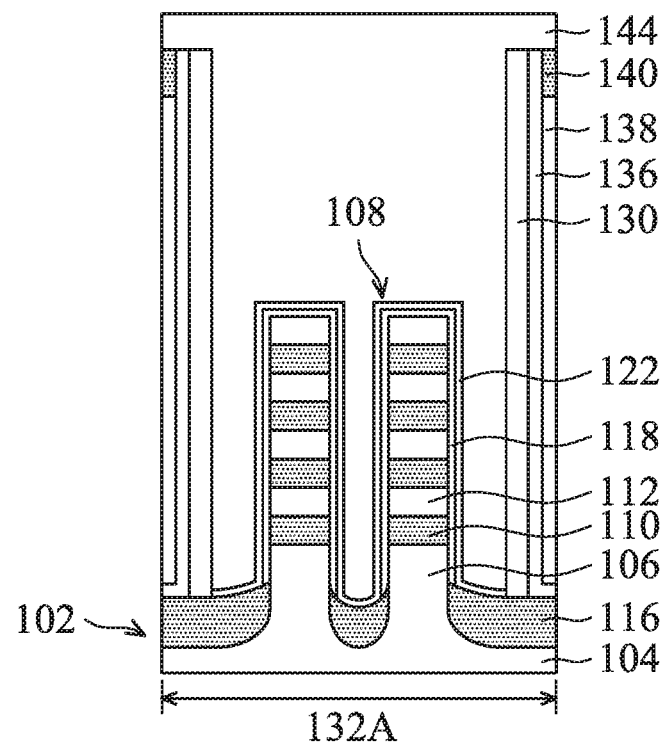
Figures 1, 3B:
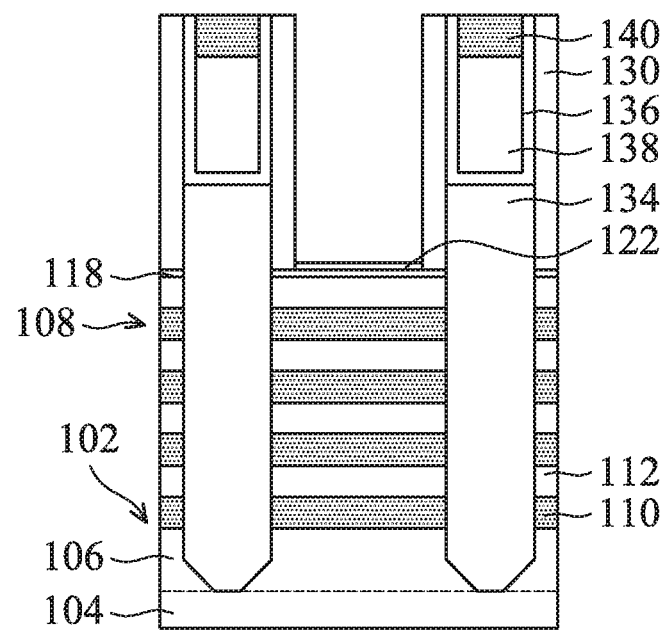
Figures 2, 3B:
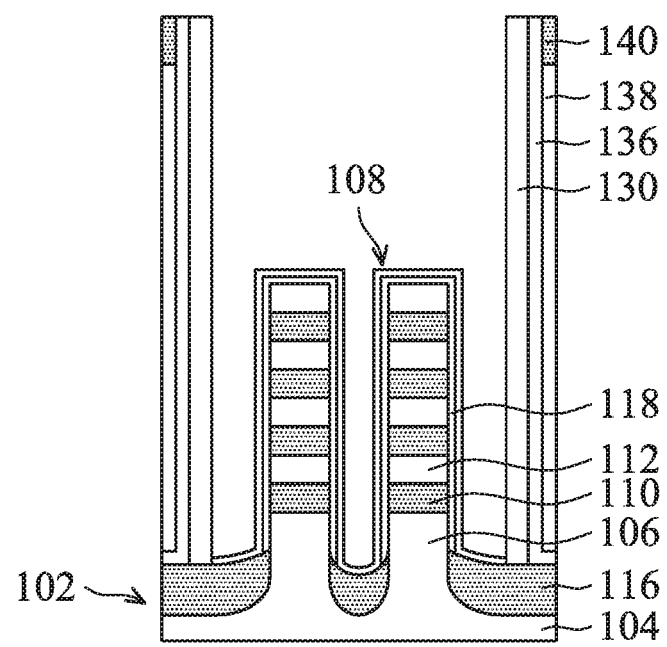
Figures 1, 3C:
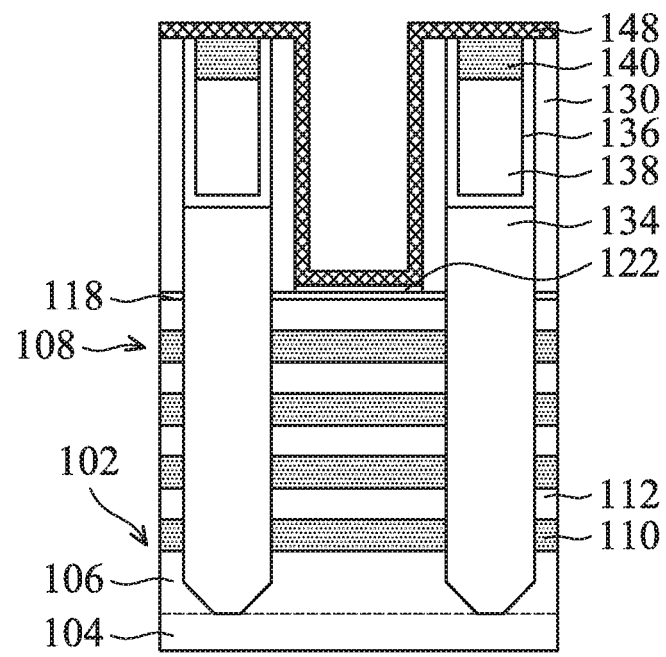
Figures 2, 3C:
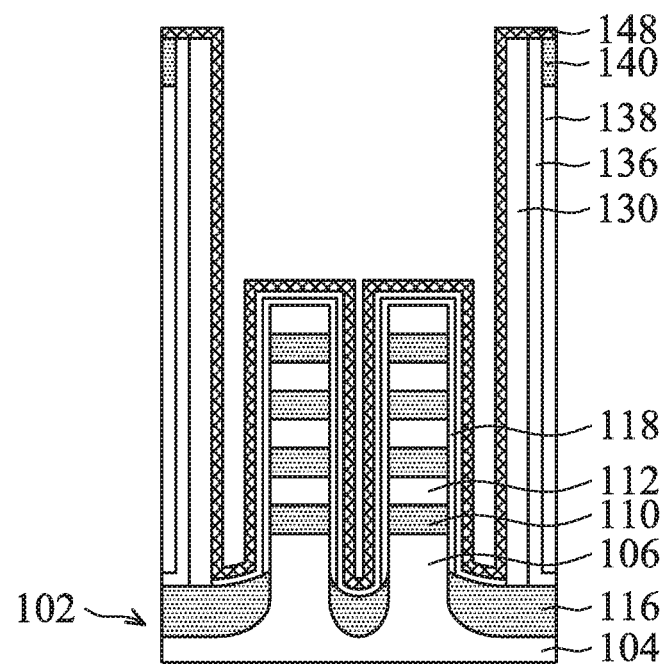
Figures 1, 3D:
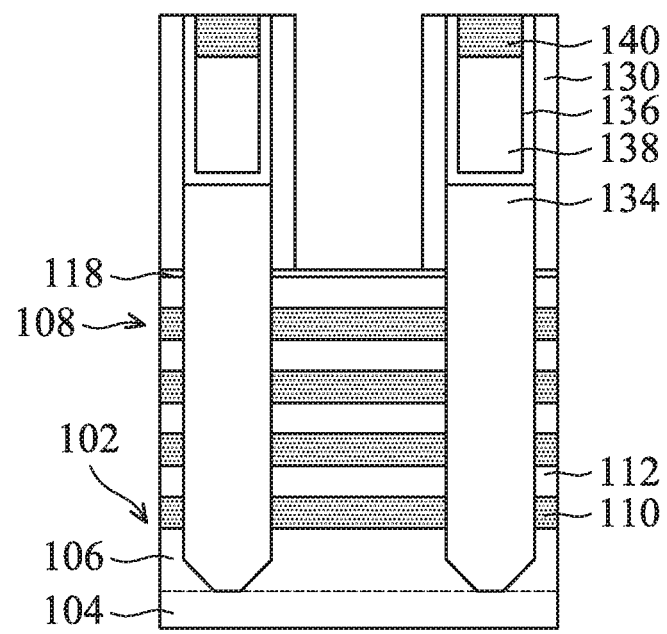
Figures 2, 3D:
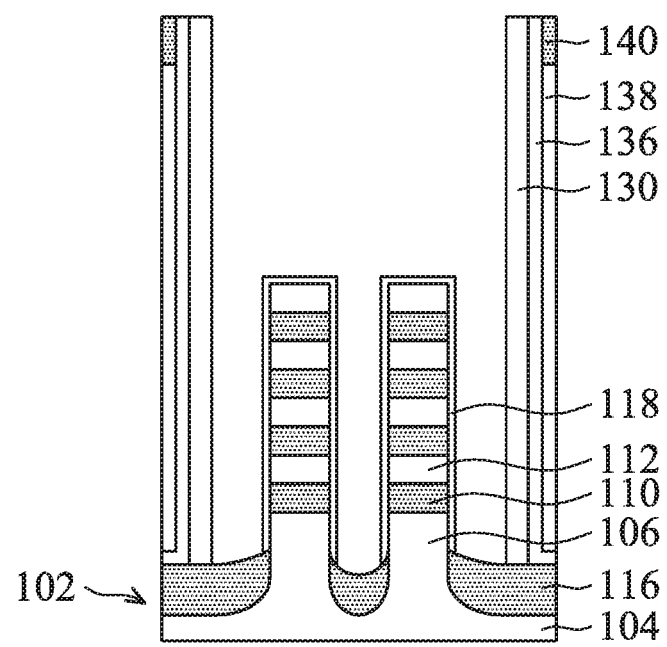
Figures 1, 3E:
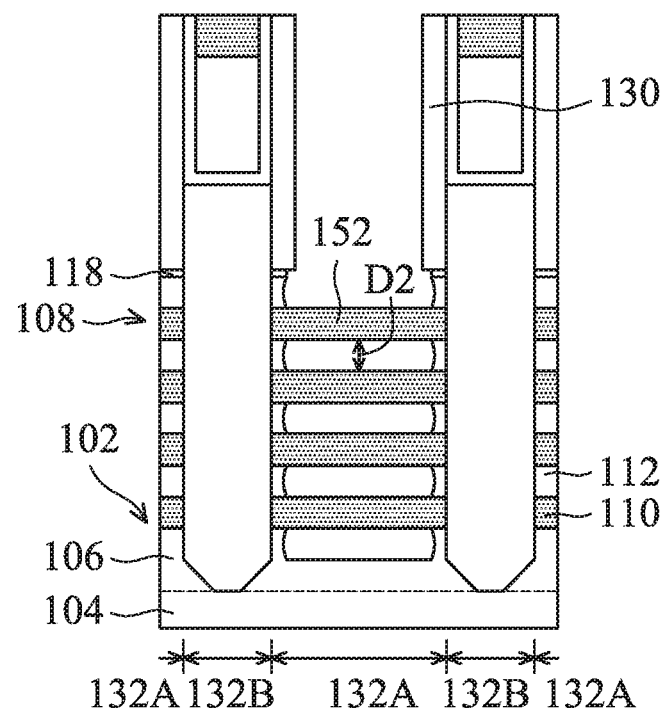
Figures 2, 3E:
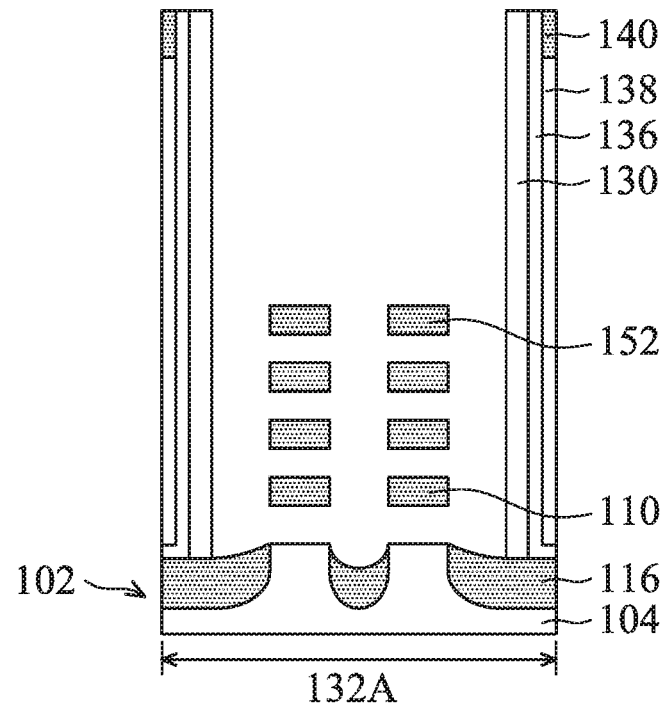
Figures 1, 3F:
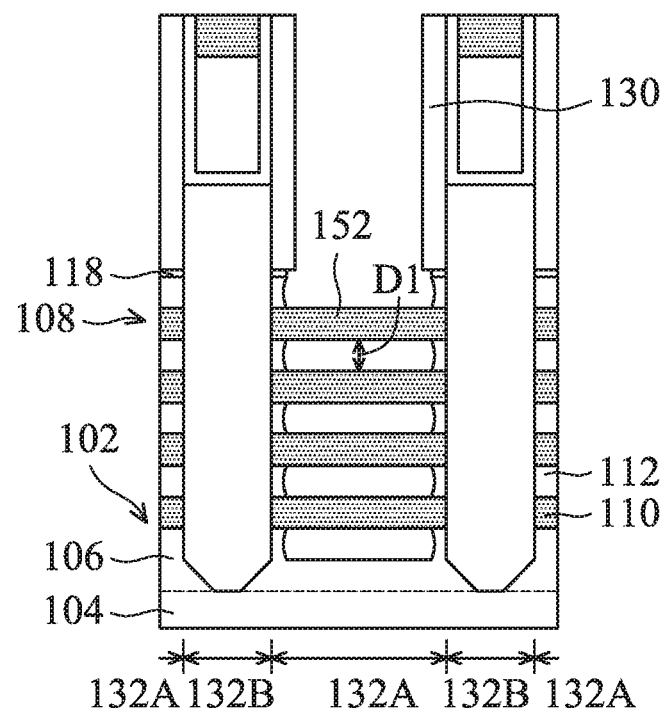
Figures 2, 3F:
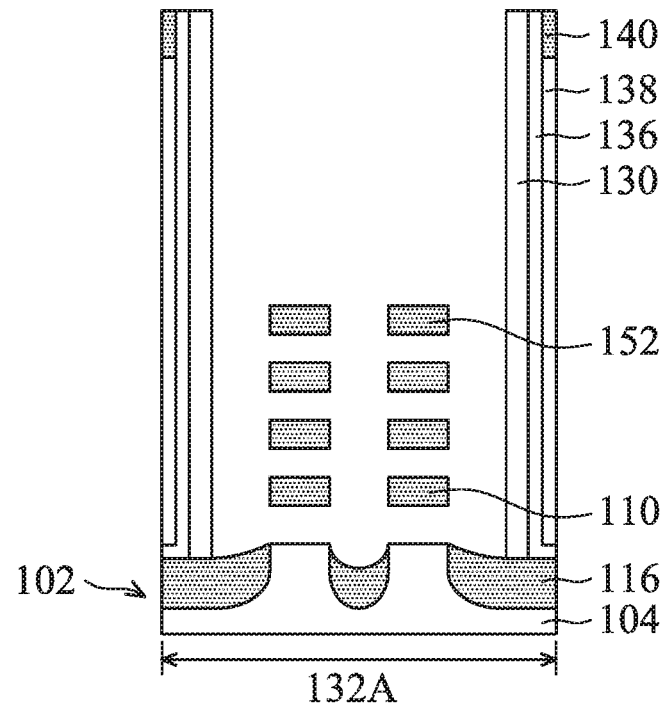
Figures 1, 3G:
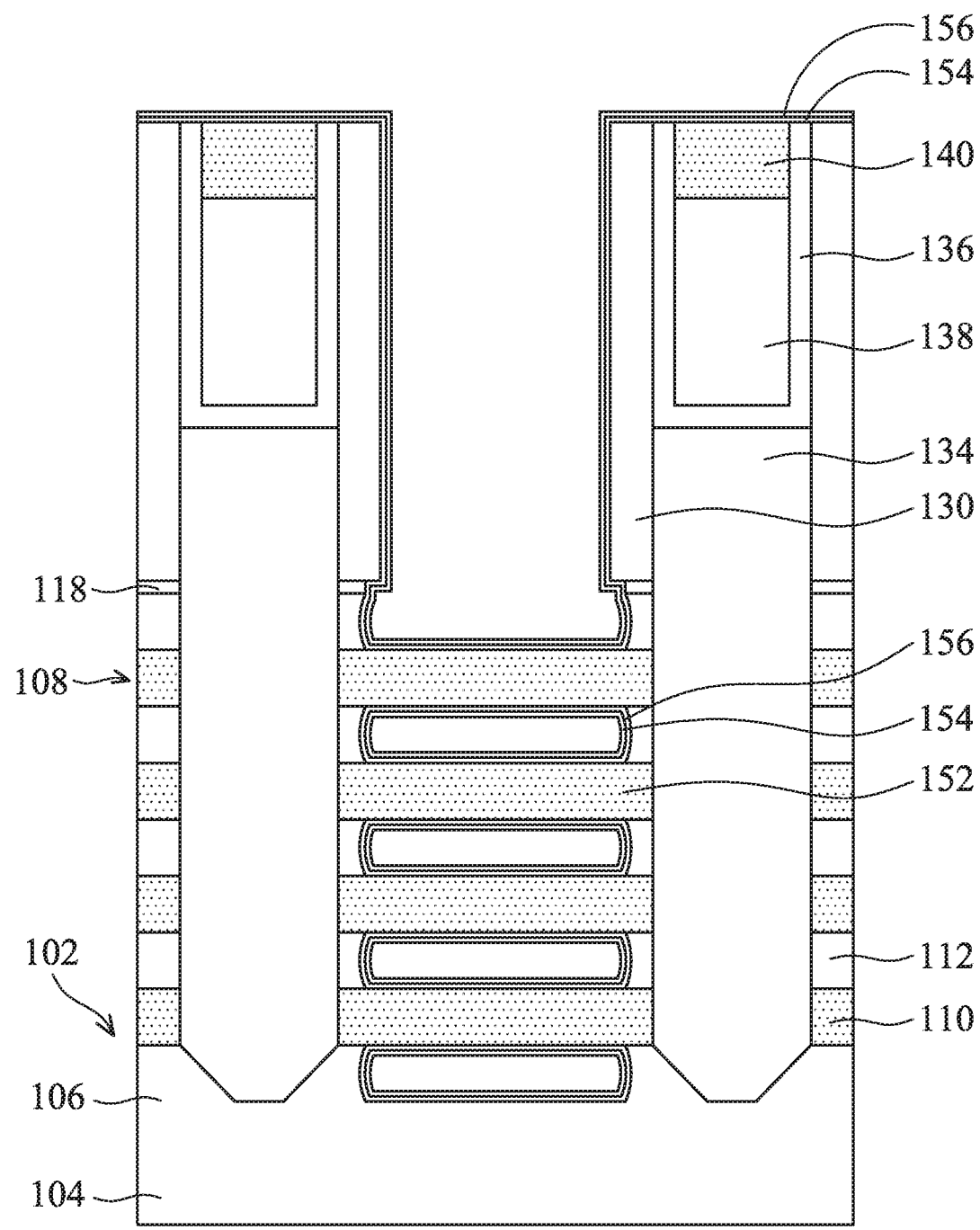
Figures 2, 3G:
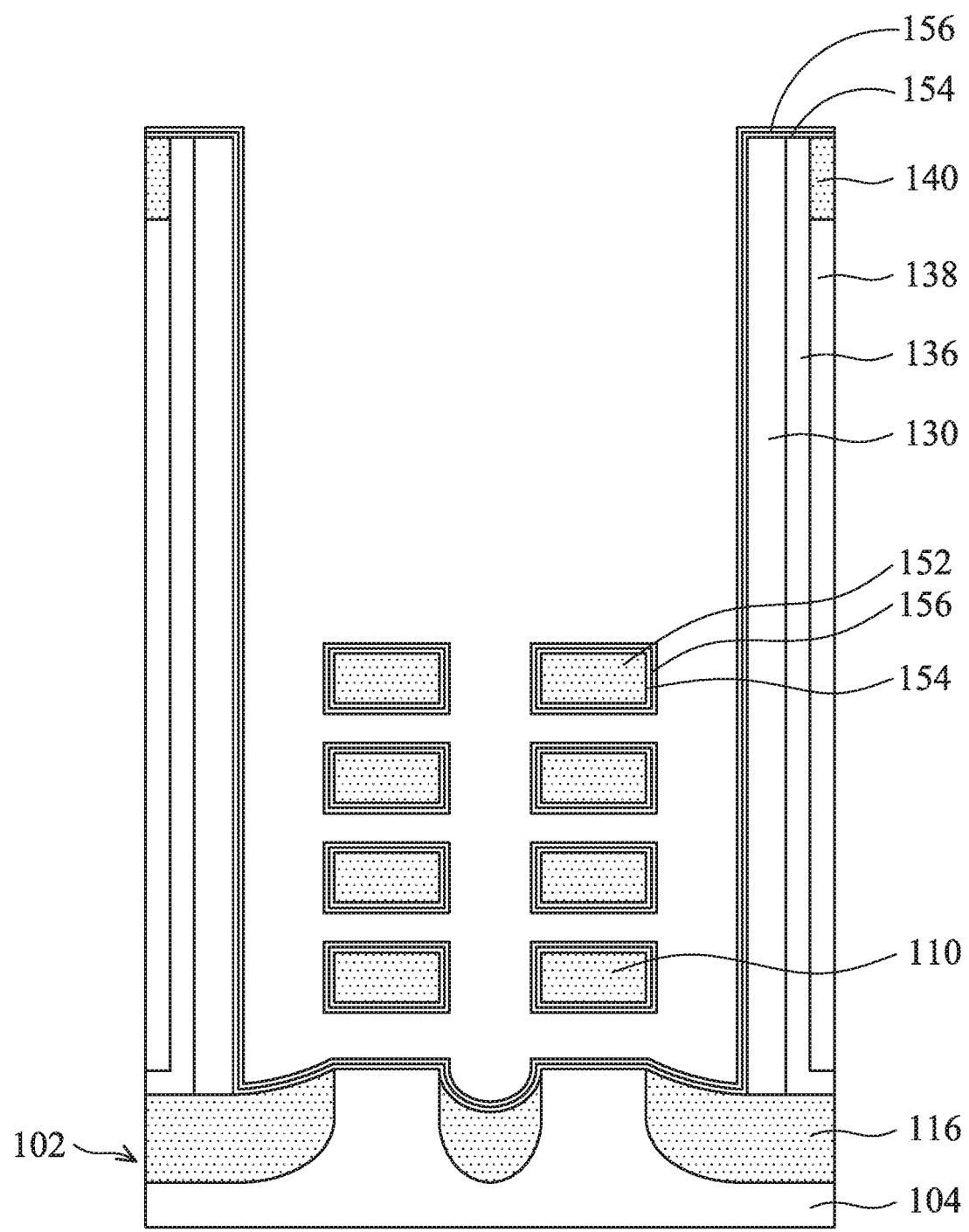

FIGS. 3A-1 to 3G-1 represent one or more semiconductor device structures positioned in the P-type region of the core region and the P-type region of the input-output region along the direction A1 shown in FIG. 4A. FIGS. 3A-2 to 3G-2 represent one or more semiconductor device structures positioned in the P-type region of the core region and the P-type region of the input-output region along the direction A2 shown in FIG. 4A.

Afterwards, as shown in FIGS. 2A-1, 2A-2, 3A-1 and 3A-2, FIGS. 2A-1 and 2A-2 represent the semiconductor device structures positioned in the N-type region of the core region and/or the N-type region of the input-output region, whereas FIGS. 3A-1 and 3A-2 represent the semiconductor device structures positioned in the P-type region of the core region and/or the P-type region of the input-output region.

As shown in FIGS. 3A-1 and 3A-2, a mask layer 144 is formed over the semiconductor device structure and covers the stack structure 108 in the P-type region of the core region and/or the P-type region of the input-output region, in accordance with some embodiments. Therefore, the stack structure 108 in the P-type region of the core region and/or the P-type region of the input-output region are blocked and protected. In some embodiments, the mask layer 144 is made of a photoresist. In some other embodiments, the mask layer 144 is made of a dielectric material. The dielectric material may include silicon oxide, silicon nitride, silicon oxynitride, silicon carbide, another suitable dielectric material, or a combination thereof.

In some embodiments, a mask material layer is deposited over the semiconductor device structures in the N-type region and the P-type region. The mask material layer may be deposited by using a chemical vapor deposition (CVD) process, a physical vapor deposition (PVD) process, a spin-on process, another applicable process, or a combination thereof. Afterwards, the mask material layer in the N-type region is removed by using a photolithography process and an etching process. The remaining portion of the mask material layer in the P-type region forms the mask layer 144.

Afterwards, as shown in FIGS. 2A-1 and 2A-2, the dummy gate dielectric layer 122 of the semiconductor device structures positioned in the N-type region of the core region and/or the N-type region of the input-output region is removed. As a result, as shown in FIGS. 2A-1 and 2A-2, the protective layer 118 in the channel region 132A is exposed, in accordance with some embodiments. In some embodiments, an etching process is used to remove the dummy gate dielectric layer 122. The etching process may include a wet etching process, a dry etching process, or a combination thereof.

Afterwards, as shown in FIGS. 2B-1, 2B-2, 3B-1 and 3B-2, FIGS. 2B-1 and 2B-2 represent the semiconductor device structures positioned in the N-type region of the core region and/or the N-type region of the input-output region, whereas FIGS. 3B-1 and 3B-2 represent the semiconductor device structures positioned in the P-type region of the core region and/or the P-type region of the input-output region.

As shown in FIGS. 3B-1 and 3B-2, the mask layer 144 is removed. In some embodiments, the mask layer 144 is removed by using an ashing process or stripping process. In some other embodiments, an etching process is used to remove the mask layer 144. The etching process may include a wet etching process, a dry etching process, or a combination thereof.

Afterwards, as shown in FIGS. 2B-1 and 2B-2, the portion of the protective layer 118 and the portion of the semiconductor layers 110 in the channel region 132A are removed by one or more etching processes, in accordance with some embodiments. The etching process may include a wet etching process, a dry etching process, or a combination thereof.

As shown in FIGS. 2B-1 and 2B-2, the remaining portion of the semiconductor layer 112 in the channel region 132A forms semiconductor nanowires 146 in the N-type region of the core region and/or the N-type region of the input-output region. As shown in FIGS. 2B-1 and 2B-2, the semiconductor nanowires 146 is positioned over the fin portion 106, in accordance with some embodiments.

In some embodiments, the semiconductor nanowires 146 in the N-type region of the core region and/or the N-type region of the input-output region are made of silicon, silicon germanium, germanium tin, silicon germanium tin, gallium arsenide, indium gallium arsenide, indium arsenide, another suitable material, or a combination thereof. In some embodiments, the semiconductor nanowires 146 in the N-type region of the core region and/or the N-type region of the input-output region are made of silicon. In some other embodiments of the present disclosure, the semiconductor nanowires 146 in the N-type region of the core region and/or the N-type region of the input-output region are made of gallium arsenide.

Figure 4E:
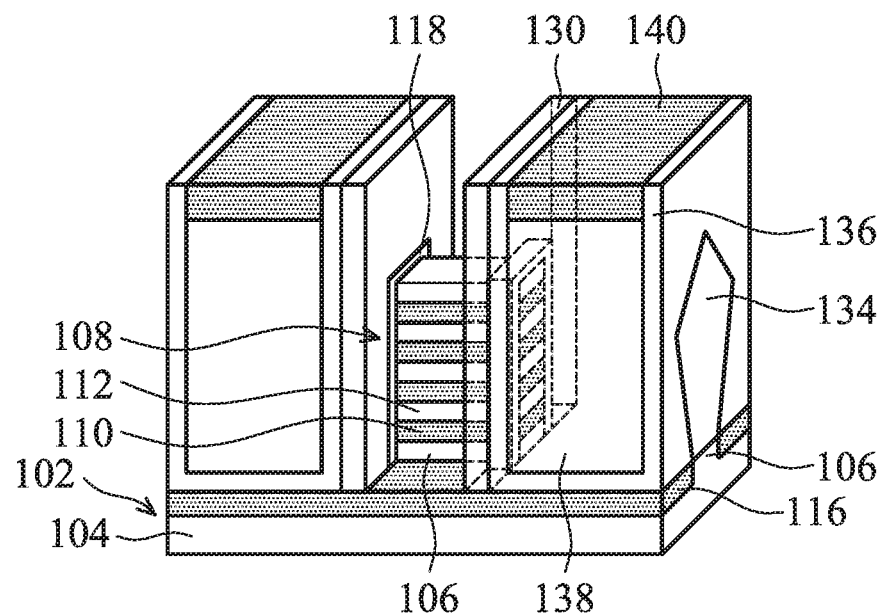
Figure 4F:
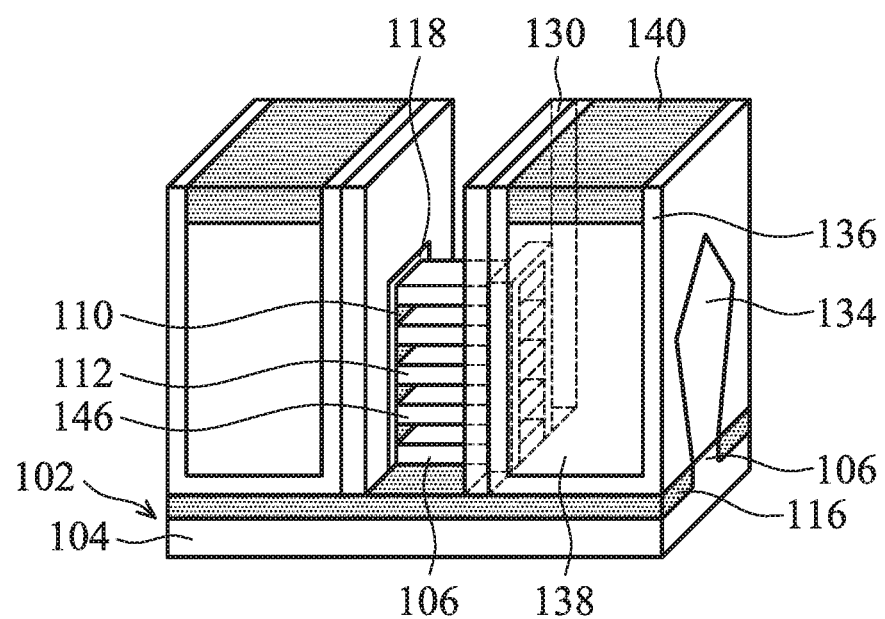

Specifically, FIGS. 4E and 4F represent the formation of the semiconductor nanowires 146 of the semiconductor device structures positioned in the N-type region of the core region and/or the N-type region of the input-output region. As shown in FIG. 4E, the portion of the protective layer 118 in the channel region 132A is removed in an etching process, in accordance with some embodiments. As shown in FIG. 4E, the semiconductor layers 110 and the semiconductor layers 112 of the stack structure 108 in the channel region 132A are exposed.

Afterwards, as shown in FIG. 4F, the portions of the semiconductor layers 110 in the channel region 132A are removed by another etching process, in accordance with some embodiments. As shown in FIG. 4F, the remaining portion of the semiconductor layer 112 in the channel region 132A forms the semiconductor nanowires 146 in the N-type region of the core region and/or the N-type region of the input-output region. As shown in FIG. 4F, the semiconductor nanowires 146 are positioned over the fin portion 106, in accordance with some embodiments.

In some embodiments, as shown in FIG. 4E, the stack structure 108 includes two or more of the semiconductor layers 110 and two or more of the semiconductor layers 112 alternately stacked vertically over the fin portion 106, in accordance with some embodiments. As shown in FIG. 4F, the etching process removes the portions of the two or more of semiconductor layers 110 in the channel region 132A, and the remaining portions of the two or more of the semiconductor layers 112 in the channel region 132A forms two or more of the semiconductor nanowires 146.

In some embodiments, the semiconductor nanowires 146 are positioned in the N-type region of the core region and/or the N-type region of the input-output region.

In some embodiments, since the semiconductor device structures positioned in the N-type region of the input-output region uses the semiconductor nanowires 146, rather than a fin structure, as a channel, the short channel effect of the semiconductor device structures positioned in the N-type region of the input-output region may be reduced or prevented.

Embodiments of the disclosure have many variations and are not limited to the embodiments mentioned above. In some other embodiments, each of the semiconductor device structures positioned in the N-type region of the core region and/or the N-type region of the input-output region only includes one semiconductor nanowire 146.

In some embodiments, the protective element 140 protects the interlayer dielectric layer 138 from being damaged in the above process which etches portions of the semiconductor layers 110 and form semiconductor nanowires 146. Therefore, the protective element 140 may improve the manufacturing yield and improve structural stability.

As shown in FIG. 2B-1, the semiconductor nanowires 146 are vertically spaced apart from each other by a first distance D1. In some embodiments, the first distance D1 is substantially equal to a thickness of the semiconductor layer 112.

Within the context of this specification, the word "substantially" means preferably at least 90%, more preferably 95%, even more preferably 98%, and most preferably 99%.

In some embodiments, as shown in FIGS. 2B-1 and 2B-2, the portion of the semiconductor layers 110 under the spacer elements 130 is also partially removed by the etching process.

Afterwards, as shown in FIGS. 2C-1, 2C-2, 3C-1 and 3C-2, FIGS. 2C-1 and 2C-2 represent the semiconductor device structures positioned in the N-type region of the core region and/or the N-type region of the input-output region, whereas FIGS. 3C-1 and 3C-2 represent the semiconductor device structures positioned in the P-type region of the core region and/or the P-type region of the input-output region.

As shown in FIGS. 2C-1, 2C-2, 3C-1 and 3C-2, a passivation layer 148 is deposited over the semiconductor device structures in the N-type region and the P-type region, in accordance with some embodiments. In some embodiments, the passivation layer 148 is made of silicon nitride, silicon oxynitride, silicon oxide, silicon carbide, another suitable material, or a combination thereof. In some embodiments, the applicable deposition methods for depositing the passivation layer 148 include a chemical vapor deposition (CVD)

process, an atomic layer deposition (ALD) process, a spin-on coating process, other applicable processes, and combinations thereof.

In particular, as shown in FIGS. 2C-1 and 2C-2, the passivation layer 148 in the N-type region of the core region and/or the N-type region of the input-output region surrounds the semiconductor nanowires 146 and fills into the space between the semiconductor nanowires 146, in accordance with some embodiments. In addition, as shown in FIGS. 2C-1 and 2C-2, the passivation layer 148 also covers the sidewalls of the protective layer 118, the sidewalls and top surface of the spacer elements 130, the top surface of the etch stop layer 136 and the top surface of the protective element 140, in accordance with some embodiments.

As shown in FIGS. 3C-1 and 3C-2, the passivation layer 148 in the P-type region of the core region and/or the P-type region of the input-output region covers the top surface of the dummy gate dielectric layer 122, the sidewalls and top surface of the spacer elements 130, the top surface of the etch stop layer 136 and the top surface of the protective element 140, in accordance with some embodiments.

As shown in FIGS. 2C-1 and 2C-2, a mask layer 150 is formed over the semiconductor device structure and covers the stack structure 108 in the N-type region of the core region and/or the N-type region of the input-output region, in accordance with some embodiments. Therefore, the passivation layer 148 in the N-type region of the core region and/or the N-type region of the input-output region are blocked and protected. In some embodiments, the mask layer 150 is made of a photoresist. In some other embodiments, the mask layer 150 is made of a dielectric material. The dielectric material may include silicon oxide, silicon nitride, silicon oxynitride, silicon carbide, another suitable dielectric material, or a combination thereof.

In some embodiments, a mask material layer is deposited over the semiconductor device structures in the P-type region and the N-type region. The mask material layer may be deposited by using a chemical vapor deposition (CVD) process, a physical vapor deposition (PVD) process, a spin-on process, another applicable process, or a combination thereof. Afterwards, the mask material layer in the P-type region is removed by using a photolithography process and an etching process. The remaining portion of the mask material layer in the N-type region forms the mask layer 150. As shown in FIGS. 3C-1 and 3C-2, the mask layer 150 exposes the P-type region of the core region and/or the P-type region of the input-output region, in accordance with some embodiments.

Afterwards, as shown in FIGS. 2D-1, 2D-2, 3D-1 and 3D-2, FIGS. 2D-1 and 2D-2 represent the semiconductor device structures positioned in the N-type region of the core region and/or the N-type region of the input-output region, whereas FIGS. 3D-1 and 3D-2 represent the semiconductor device structures positioned in the P-type region of the core region and/or the P-type region of the input-output region.

As shown in FIGS. 3D-1 and 3D-2, the passivation layer 148 and the dummy gate dielectric layer 122 in the P-type region of the core region and/or the P-type region of the input-output region are removed, in accordance with some embodiments. In some embodiments, the protective layer 118 in the channel region 132A in the P-type region of the core region and/or the P-type region of the input-output region is exposed, in accordance with some embodiments.

In some embodiments, the passivation layer 148 and the dummy gate dielectric layer 122 in the P-type region are removed by one or more etching processes. The etching processes may include a wet etching process, a dry etching process, or a combination thereof.

Afterwards, as shown in FIGS. 2D-1 and 2D-2, the mask layer 150 is removed. In some embodiments, the mask layer 150 is removed by using an ashing process or stripping process. In some other embodiments, an etching process is used to remove the mask layer 150. The etching process may include a wet etching process, a dry etching process, or a combination thereof.

Afterwards, as shown in FIGS. 2E-1, 2E-2, 3E-1 and 3E-2, FIGS. 2E-1 and 2E-2 represent the semiconductor device structures positioned in the N-type region of the core region and/or the N-type region of the input-output region, whereas FIGS. 3E-1 and 3E-2 represent the semiconductor device structures positioned in the P-type region of the core region and/or the P-type region of the input-output region.

Afterwards, as shown in FIGS. 3E-1 and 3E-2, the portion of the protective layer 118 in the channel region 132A, the portion of the semiconductor layers 112 in the channel region 132A, and an upper portion of the fin structure 106 of the semiconductor substrate 102 in the channel region 132A are removed by one or more etching processes, in accordance with some embodiments. The etching process may include a wet etching process, a dry etching process, or a combination thereof.

As shown in FIGS. 3E-1 and 3E-2, the remaining portion of the semiconductor layer 110 in the channel region 132A forms semiconductor nanowires 152 in the P-type region of the core region and/or the P-type region of the input-output region. As shown in FIGS. 3E-1 and 3E-2, the semiconductor nanowires 152 is positioned over the fin portion 106, in accordance with some embodiments.

In some embodiments, the semiconductor nanowires 152 in the P-type region of the core region and/or the P-type region of the input-output region are made of silicon, silicon germanium, germanium tin, silicon germanium tin, gallium arsenide, indium gallium arsenide, indium arsenide, another suitable material, or a combination thereof. In some embodiments, the semiconductor nanowires 152 in the P-type region of the core region and/or the P-type region of the input-output region are made of silicon germanium. In some other embodiments of the present disclosure, the semiconductor nanowires 152 in the P-type region of the core region and/or the P-type region of the input-output region are made of indium gallium arsenide.

Figure 4G:
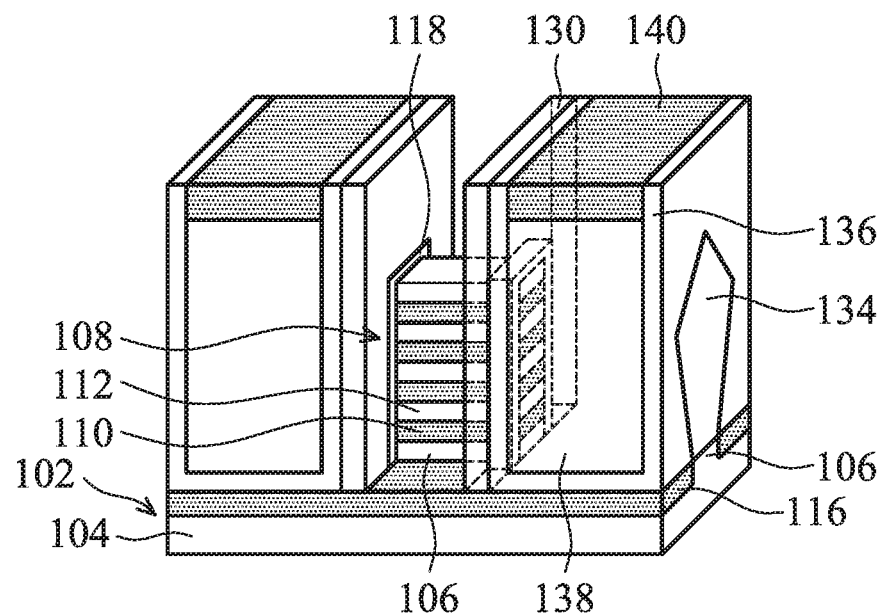
Figure 4H:
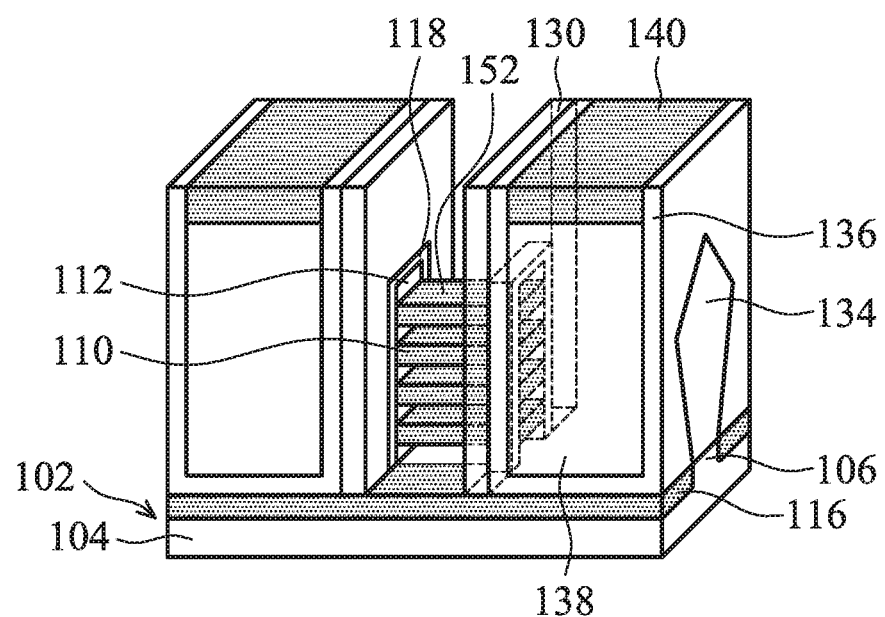

Specifically, FIGS. 4G and 4H represent the formation of the semiconductor nanowires 152 of the semiconductor device structures positioned in the P-type region of the core region and/or the P-type region of the input-output region. As shown in FIG. 4G, the portion of the protective layer 118 in the channel region 132A is removed in an etching process, in accordance with some embodiments. As shown in FIG. 4G, the semiconductor layers 112 and the semiconductor layers 110 of the stack structure 108 in the channel region 132A are exposed.

Afterwards, as shown in FIG. 4H, the portion of the semiconductor layers 112 in the channel region 132A and the upper portion of the fin structure 106 of the semiconductor substrate 102 in the channel region 132A are removed by another etching process, in accordance with some embodiments. As shown in FIG. 4H, the remaining portion of the semiconductor layer 110 in the channel region 132A forms the semiconductor nanowires 152 in the P-type region of the core region and/or the P-type region of the input-output region.

In some embodiments, as shown in FIG. 4G, the stack structure 108 includes two or more of the semiconductor layers 112 and two or more of the semiconductor layers 110 alternately stacked vertically over the fin portion 106, in accordance with some embodiments. As shown in FIG. 4H, the etching process removes the portions of the two or more of semiconductor layers 112 in the channel region 132A, and the remaining portions of the two or more of the semiconductor layers 110 in the channel region 132A forms two or more of the semiconductor nanowires 152.

Embodiments of the disclosure have many variations and are not limited to the embodiments mentioned above. In some other embodiments, each of the semiconductor device structures positioned in the P-type region of the core region and/or the P-type region of the input-output region only includes one semiconductor nanowire 152.

In some embodiments, the semiconductor nanowires 152 are positioned in the P-type region of the core region and/or the P-type region of the input-output region.

In some embodiments, since the semiconductor device structures positioned in the P-type region of the input-output region uses the semiconductor nanowires 152, rather than a fin structure, as a channel, the short channel effect of the semiconductor device structures positioned in the P-type region of the input-output region may be reduced or prevented.

In some embodiments, the protective element 140 protects the interlayer dielectric layer 138 from being damaged in the above process which etches portions of the semiconductor layers 112 and form semiconductor nanowires 152. Therefore, the protective element 140 may improve the manufacturing yield and improve structural stability.

As shown in FIG. 3E-1, the semiconductor nanowires 152 are vertically spaced apart from each other by a second distance D2. In some embodiments, the second distance D2 is substantially equal to the thickness of the semiconductor layer 112.

In some embodiments, as shown in FIGS. 3E-1 and 3E-2, the portion of the semiconductor layers 112 under the spacer elements 130 is also partially removed by the etching process.

In some embodiments, as shown in FIGS. 3E-1 and 3E-2, the portion of the protective layer 118 under the spacer elements 130 is also partially removed by the etching process.

Afterwards, as shown in FIGS. 2F-1, 2F-2, 3F-1 and 3F-2, FIGS. 2F-1 and 2F-2 represent the semiconductor device structures positioned in the N-type region of the core region and/or the N-type region of the input-output region, whereas FIGS. 3F-1 and 3F-2 represent the semiconductor device structures positioned in the P-type region of the core region and/or the P-type region of the input-output region.

As shown in FIGS. 2F-1 and 2F-2, the passivation layer 148 in the N-type region is removed by one or more etching processes. The etching processes may include a wet etching process, a dry etching process, or a combination thereof.

Afterwards, as shown in FIGS. 2G-1, 2G-2, 3G-1 and 3G-2, FIGS. 2G-1 and 2G-2 represent the semiconductor device structures positioned in the N-type region of the core region and/or the N-type region of the input-output region, whereas FIGS. 3G-1 and 3G-2 represent the semiconductor device structures positioned in the P-type region of the core region and/or the P-type region of the input-output region.

As shown in FIGS. 2G-1, 2G-2, 3G-1 and 3G-2, a protective layer 154 is conformally deposited over the semiconductor device structures positioned in the N-type region of the core region, the N-type region of the input-output region, the P-type region of the core region and/or the P-type region of the input-output region, in accordance with some embodiments.

Specifically, as shown in FIGS. 2G-1 and 2G-2, the protective layer 154 in the N-type region of the core region and/or the N-type region of the input-output region surrounds the semiconductor nanowire 146 in the channel region 132A and covers the sidewalls of the protective layer 118, the sidewalls and top surface of the spacer elements 130, the top surface of the etch stop layer 136 and the top surface of the protective element 140, in accordance with some embodiments.

In addition, as shown in FIGS. 3G-1 and 3G-2, the protective layer 154 in the P-type region of the core region and/or the P-type region of the input-output region surrounds the semiconductor nanowire 152 in the channel region 132A and covers the sidewalls and bottom surface of the etched portion of the fin structure 106, the sidewalls of the semiconductor layers 112, the sidewalls of the protective layer 118, the sidewalls and top surface of the spacer elements 130, the top surface of the etch stop layer 136 and the top surface of the protective element 140, in accordance with some embodiments.

In some embodiments, the protective layer 154 is made of silicon, silicon germanium, oxide material such as silicon oxide, nitride material such as silicon nitride, sulfide material such as silicon sulfide, another suitable material, or a combination thereof.

In some embodiments, the applicable deposition methods for depositing the protective layer 154 include a chemical vapor deposition (CVD) process, an atomic layer deposition (ALD) process, a thermal oxidation process, a nitridation process, a sulfidation process, a spin-on coating process, other applicable processes, and combinations thereof.

In some embodiments, before depositing the protective layer 154, the semiconductor nanowire 152 and semiconductor nanowire 146 are cleaned by a clean process. In some embodiments, the protective element 140 protects the interlayer dielectric layer 138 from being damaged in this clean process. Therefore, the protective element 140 may improve the manufacturing yield and improve structural stability.

Embodiments of the disclosure have many variations and are not limited to the embodiments mentioned above. In some other embodiments, no protective layer 154 is formed in the N-type region of the core region and/or the N-type region of the input-output region. In some other embodiments, no protective layer 154 is formed in the P-type region of the core region and/or the P-type region of the input-output region. In some other embodiments, no protective layer 154 is formed in the N-type region of the core region, the N-type region of the input-output region, the P-type region of the core region and/or the P-type region of the input-output region.

Still referring to FIGS. 2G-1, 2G-2, 3G-1 and 3G-2, a dielectric layer 156 is conformally deposited over the semiconductor device structures positioned in the N-type region of the core region, the N-type region of the input-output region, the P-type region of the core region and/or the P-type region of the input-output region, in accordance with some embodiments.

Specifically, as shown in FIGS. 2G-1 and 2G-2, the dielectric layer 156 in the N-type region of the core region and/or the N-type region of the input-output region are conformally deposited over the protective layer 154. As shown in FIGS. 2G-1 and 2G-2, the dielectric layer 156 in the N-type region of the core region and/or the N-type region of the input-output region surround the semiconductor nanowire 146 and/or the protective layer 154 in the channel region 132A, in accordance with some embodiments. As shown in FIGS. 2G-1 and 2G-2, the dielectric layer 156 in the N-type region of the core region and/or the N-type region of the input-output region cover the sidewalls of the protective layer 118, the sidewalls and top surface of the spacer elements 130, the top surface of the etch stop layer 136 and the top surface of the protective element 140, in accordance with some embodiments.

In addition, as shown in FIGS. 3G-1 and 3G-2, the dielectric layer 156 in the P-type region of the core region and/or the P-type region of the input-output region are conformally deposited over the protective layer 154. As shown in FIGS. 3G-1 and 3G-2, the dielectric layer 156 in the P-type region of the core region and/or the P-type region of the input-output region surround the semiconductor nanowire 152 and/or the protective layer 154 in the channel region 132A, in accordance with some embodiments. As shown in FIGS. 3G-1 and 3G-2, the dielectric layer 156 in the P-type region of the core region and/or the P-type region of the input-output region cover the sidewalls and bottom surface of the etched portion of the fin structure 106, the sidewalls of the semiconductor layers 112, the sidewalls of the protective layer 118, the sidewalls and top surface of the spacer elements 130, the top surface of the etch stop layer 136 and the top surface of the protective element 140, in accordance with some embodiments.

In some embodiments, the portion of the dielectric layer 156 surrounding the semiconductor nanowire 146 and/or the semiconductor nanowire 152 is also referred to as a gate dielectric layer 156. In some embodiments, the portion of the dielectric layer 156 surrounding the semiconductor nanowire 146 and/or the semiconductor nanowire 152 in the N-type region of the input-output region and/or the P-type region of the input-output region is also referred to as a input-output gate dielectric layer 156 (10 gate dielectric layer).

In some embodiments, the dielectric layer 156 is made of silicon oxide, silicon nitride, silicon oxynitride, another suitable material, or a combination thereof. In some embodiments, the applicable deposition methods for depositing the dielectric layer 156 include a chemical vapor deposition (CVD) process, an atomic layer deposition (ALD) process, a spin-on coating process, other applicable processes, and combinations thereof.

Afterwards, in some embodiments, an annealing process is performed on the gate dielectric layer 156. For example, a rapid thermal annealing process is performed.

In some embodiments, since the annealing process 156 is performed on the gate dielectric layer after the formation of the semiconductor nanowire 146 and/or the semiconductor nanowire 152, the semiconductor layers 110 and the semiconductor layers 112 in the channel region 132A do not intermix with each other at the interface between these layers. Therefore, the quality of the semiconductor nanowire 146 and/or the semiconductor nanowire 152 may be improved. In addition, the manufacturing yield may also be improved.

In addition, since the dielectric layer 156 is formed after the formation of the semiconductor nanowire 146 and/or the semiconductor nanowire 152, the protective layer 154, which is positioned between the semiconductor nanowire 146, 152 and the dielectric layer 156, may be formed after the formation of the semiconductor nanowire 146 and/or the semiconductor nanowire 152.

Furthermore, since the dielectric layer 156 is formed after the formation of the semiconductor nanowire 146 and/or the semiconductor nanowire 152, rather than being formed before the formation of the semiconductor nanowire 146 and/or the semiconductor nanowire 152, the embodiments of the present disclosure prevent the dielectric layer 156 from being damaged by the process performed before the formation of the semiconductor nanowire 146 and/or the semiconductor nanowire 152, or by the process for forming the semiconductor nanowire 146 and/or the semiconductor nanowire 152.

Figures 1, 2I:
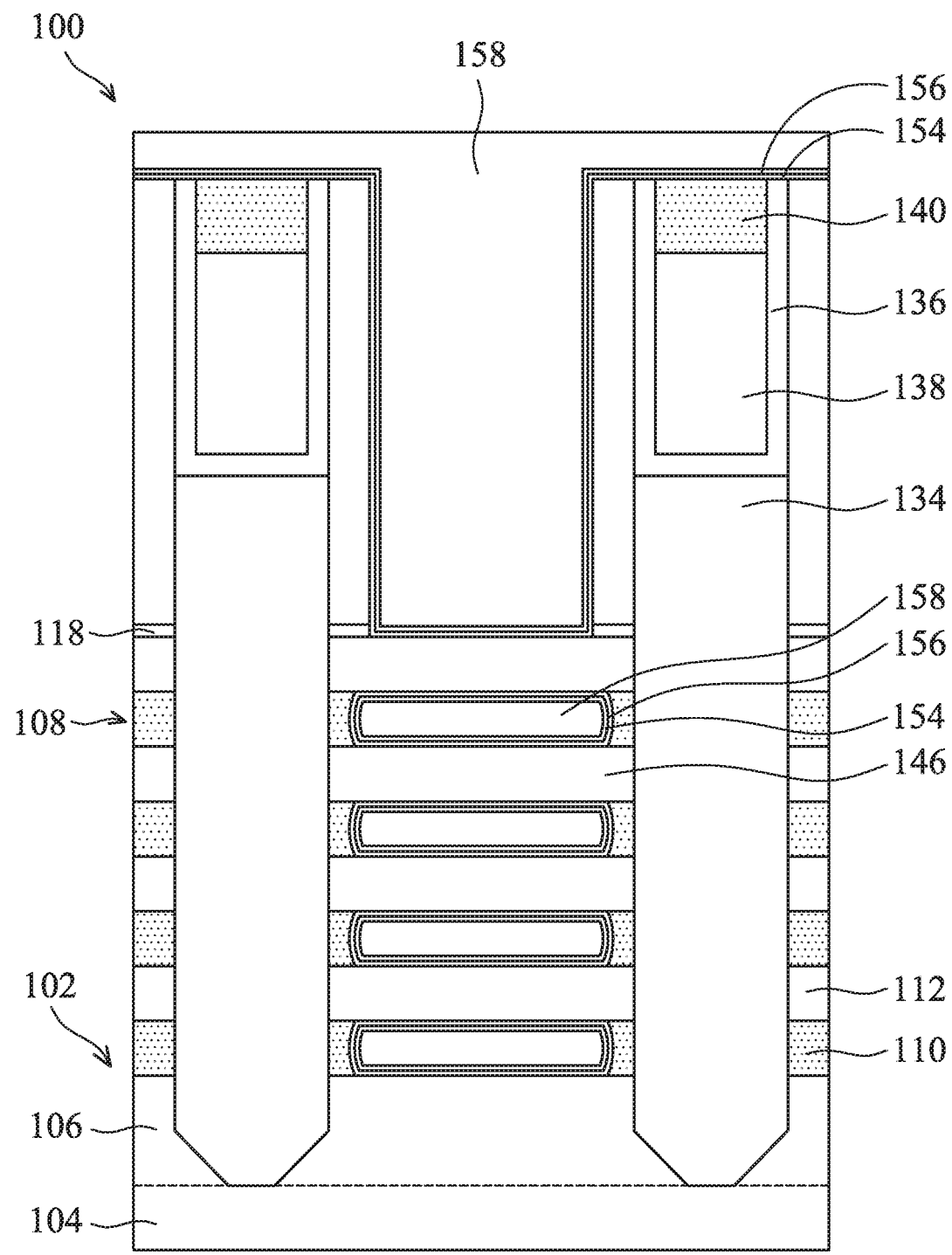
Figures 2, 2I:
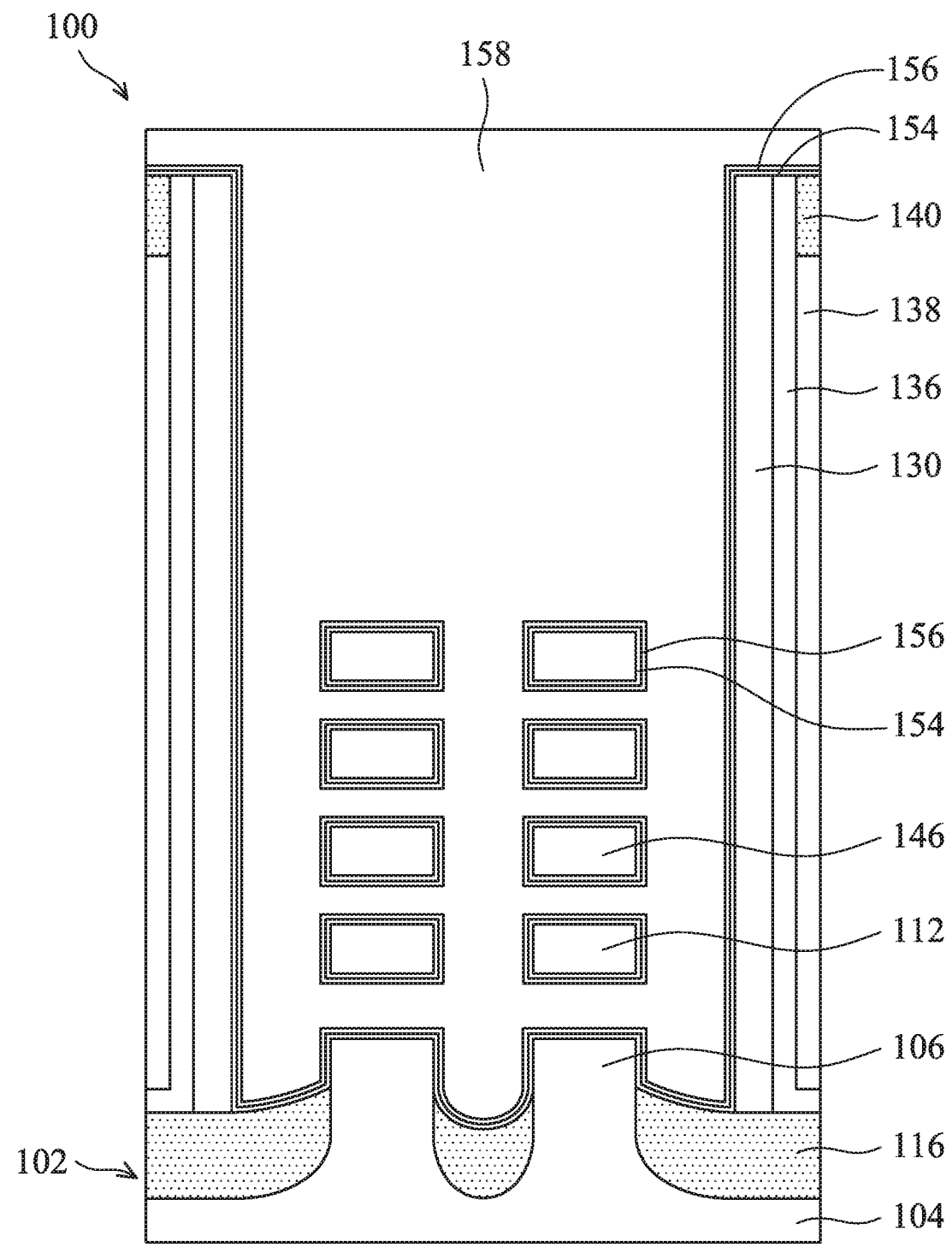
Figures 1, 3H:
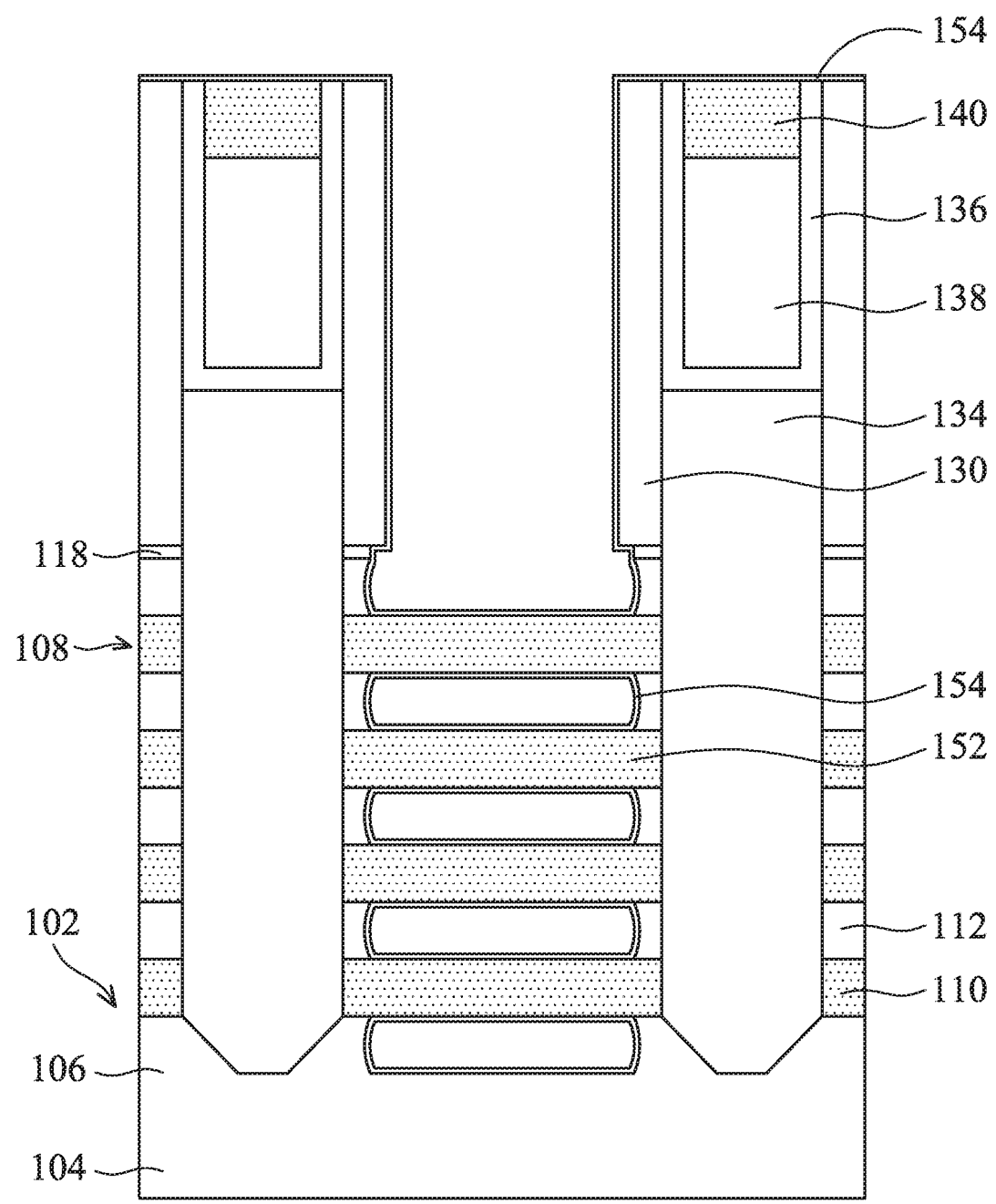
Figures 2, 3H:
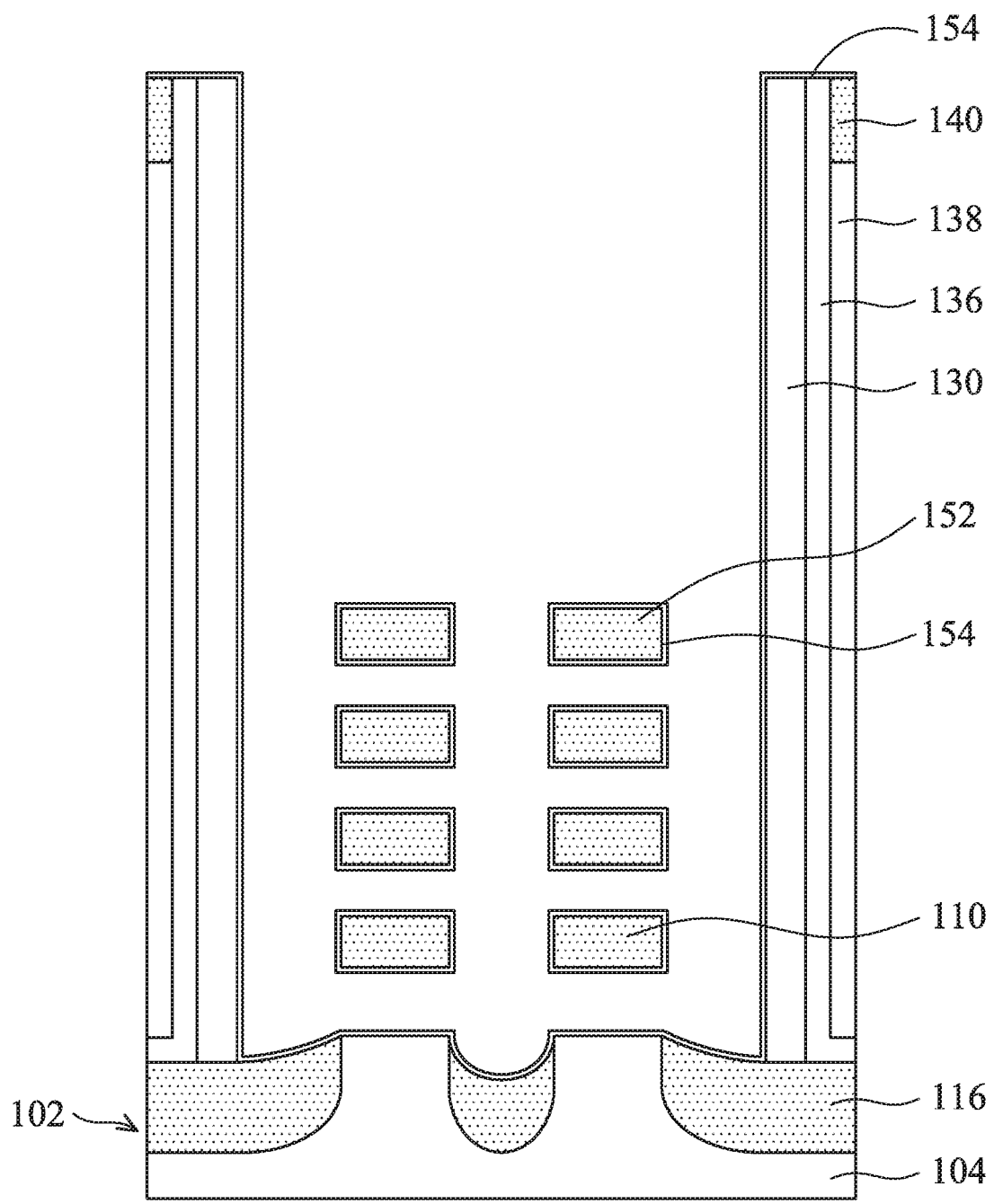
Figures 1, 3I:
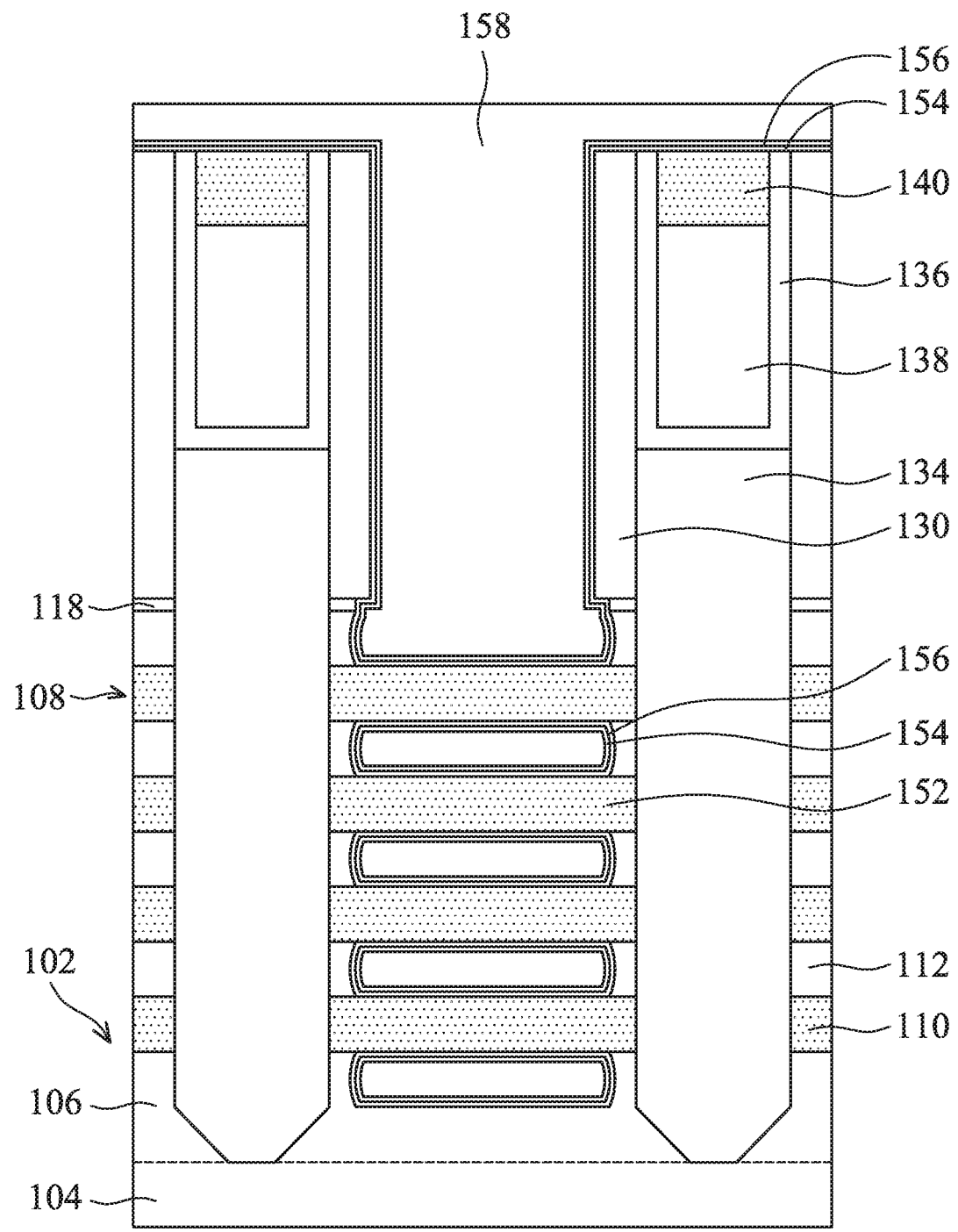
Figures 2, 3I:
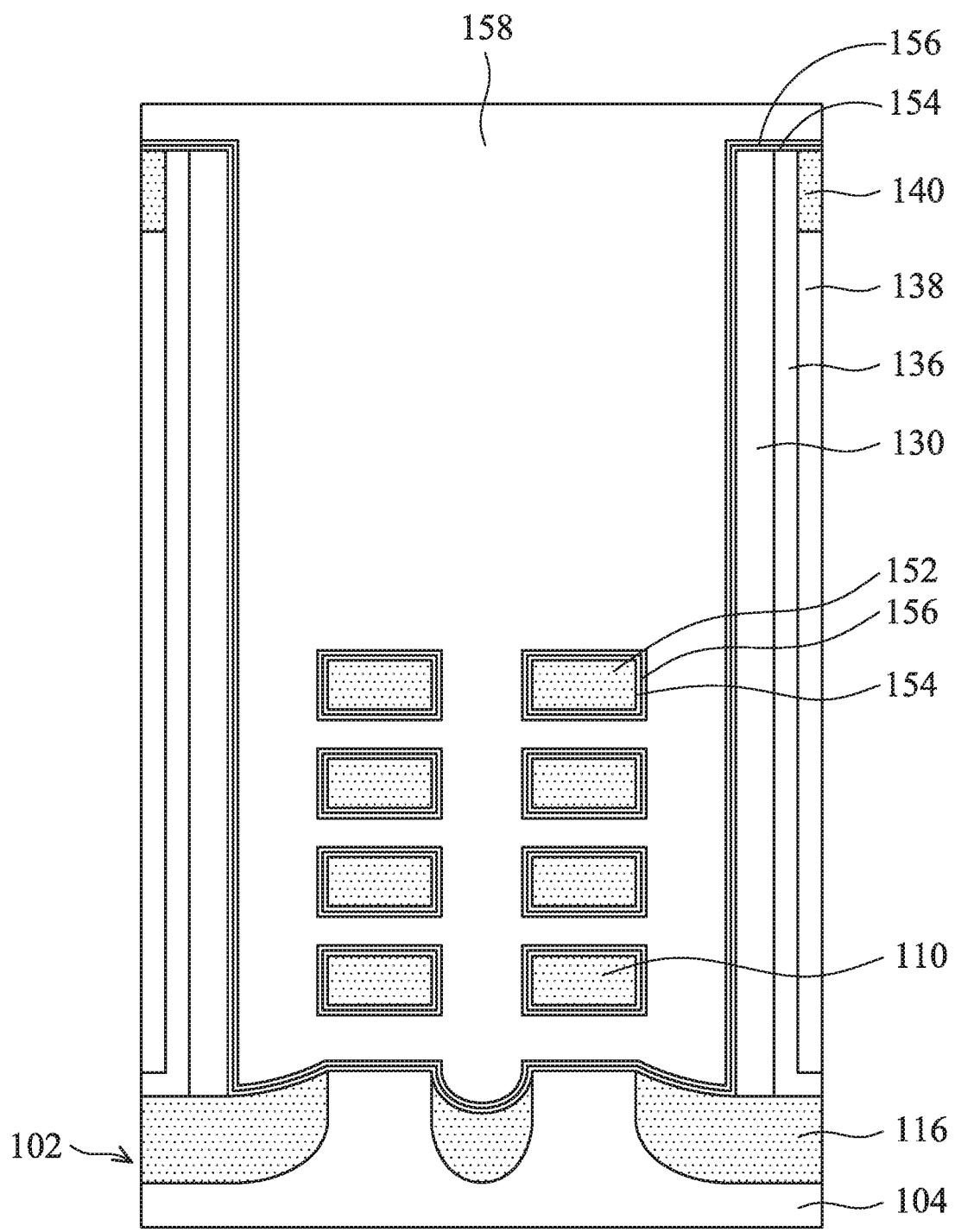

Afterwards, as shown in FIGS. 2H-1, 2H-2, 2I-1, 2I-2, 3H-1, 3H-2, 3I-1, 3I-2, FIGS. 2H-1 and 2H-2 represent the semiconductor device structure positioned in the N-type region of the core region, FIGS. 2I-1 and 2I-2 represent the semiconductor device structure positioned in the N-type region of the input-output region. FIGS. 3H-1 and 3H-2 represent the semiconductor device structure positioned in the P-type region of the core region, FIGS. 3I-1 and 3I-2 represent the semiconductor device structure positioned in the P-type region of the input-output region.

As shown in FIGS. 2I-1, 2I-2, 3I-1 and 3I-2, a mask layer 158 is formed over the semiconductor device structure and covers the dielectric layer 156 in the N-type region and/or the P-type region of the input-output region, in accordance with some embodiments. Therefore, the dielectric layer 156 in the N-type region and/or the P-type region of the input-output region are blocked and protected. In some embodiments, the mask layer 158 is made of a photoresist. In some other embodiments, the mask layer 158 is made of a dielectric material. The dielectric material may include silicon oxide, silicon nitride, silicon oxynitride, silicon carbide, another suitable dielectric material, or a combination thereof.

In some embodiments, a mask material layer is deposited over the semiconductor device structures in the core region and the input-output region. The mask material layer may be deposited by using a chemical vapor deposition (CVD) process, a physical vapor deposition (PVD) process, a spin-on process, another applicable process, or a combination thereof. Afterwards, the mask material layer in the core region is removed by using a photolithography process and an etching process. The remaining portion of the mask material layer in the input-output region forms the mask layer 158.

Afterwards, as shown in FIGS. 2H-1, 2H-2, 3H-1 and 3H-2, the dielectric layer 156 of the semiconductor device structures positioned in the N-type region of the core region and P-type region of the core region is removed. In some embodiments, an etching process is used to remove the dielectric layer 156 in the N-type region of the core region and P-type region of the core region. The etching process may include a wet etching process, a dry etching process, or a combination thereof.

Afterwards, after the dielectric layer 156 in the N-type region of the core region and P-type region of the core region is removed, the mask layer 158 is removed. In some embodiments, the mask layer 158 is removed by using an ashing process or stripping process. In some other embodiments, an etching process is used to remove the mask layer 158. The etching process may include a wet etching process, a dry etching process, or a combination thereof.

Figures 1, 2J:
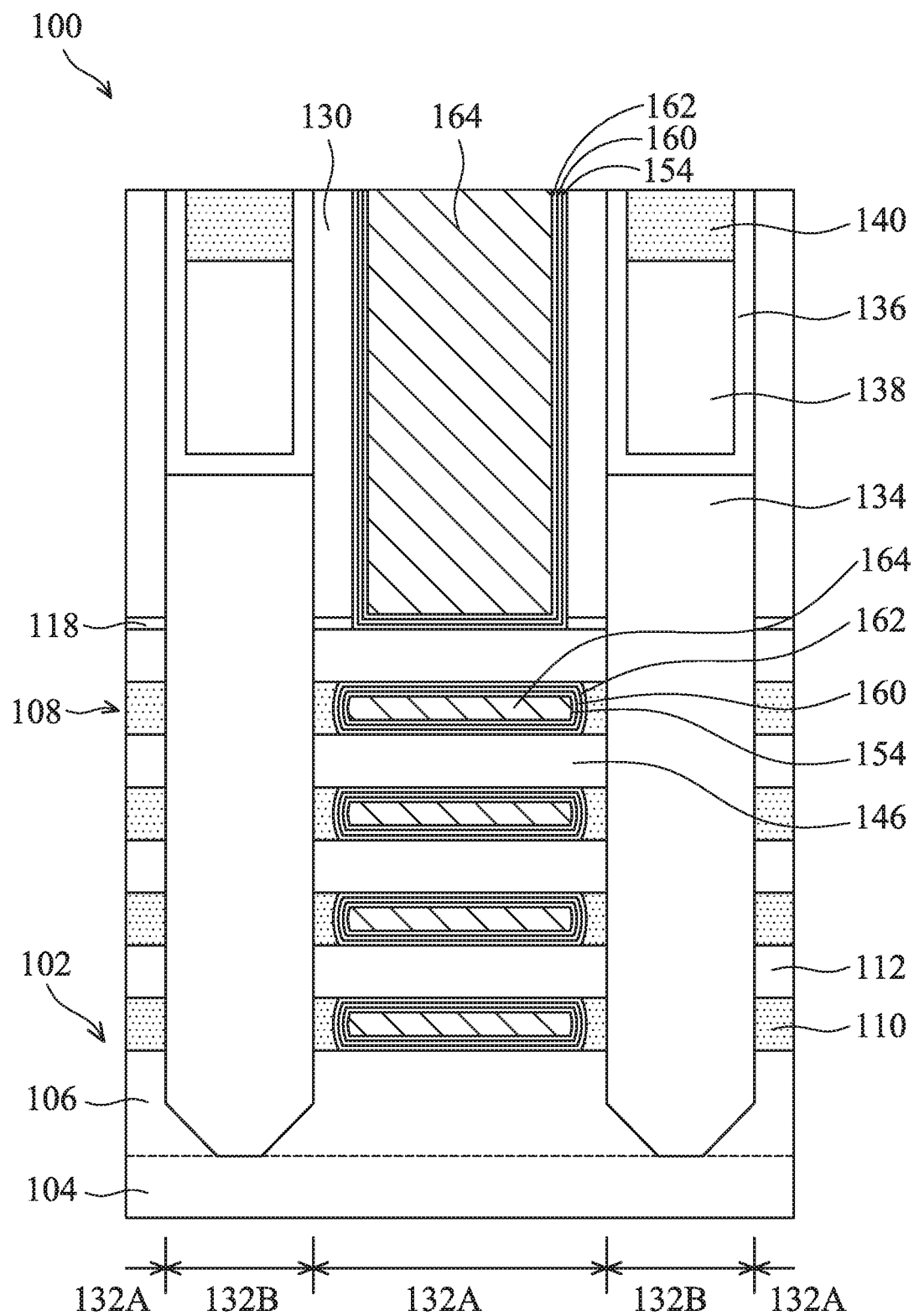
Figures 2, 2J:
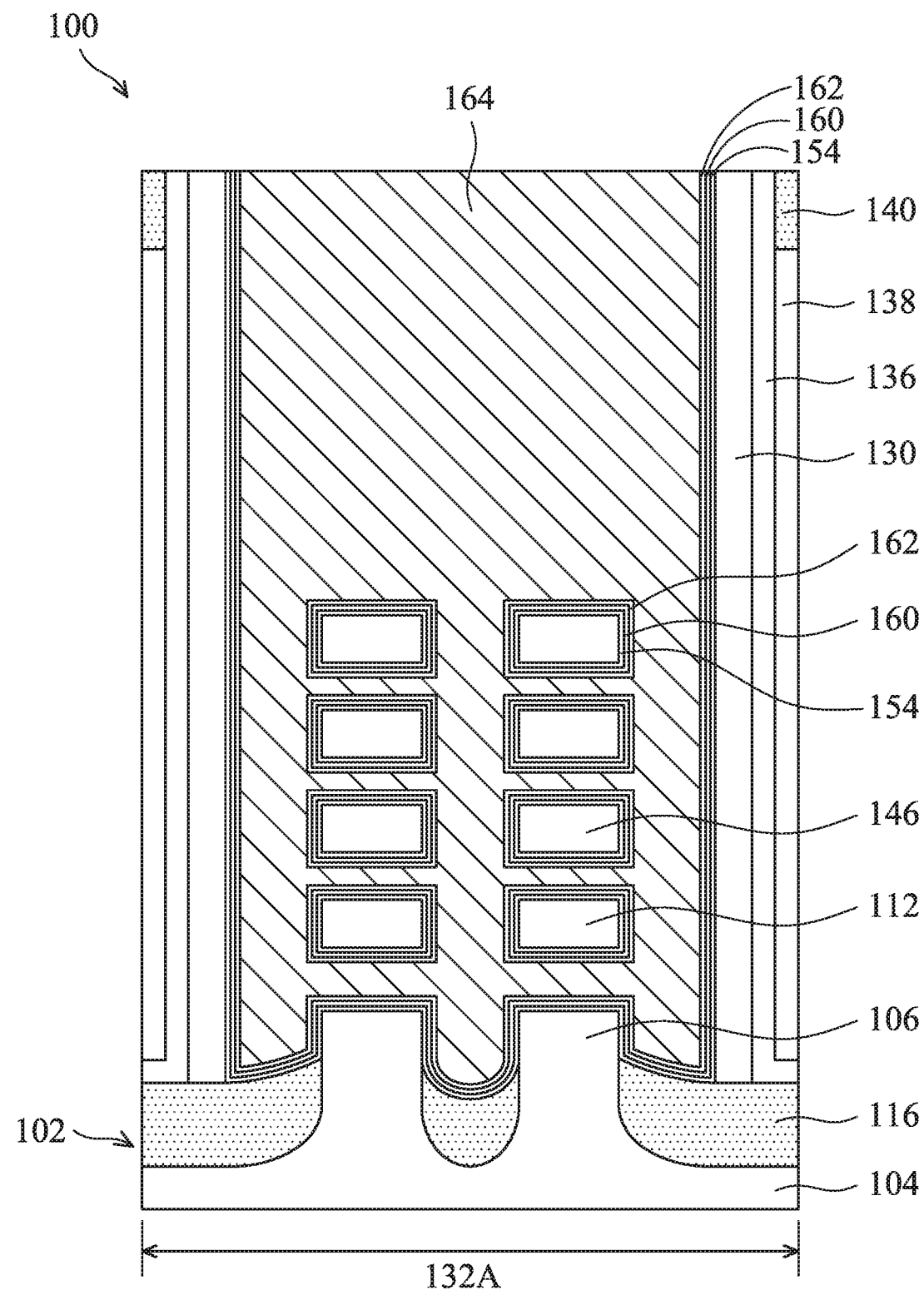
Figures 1, 2K:
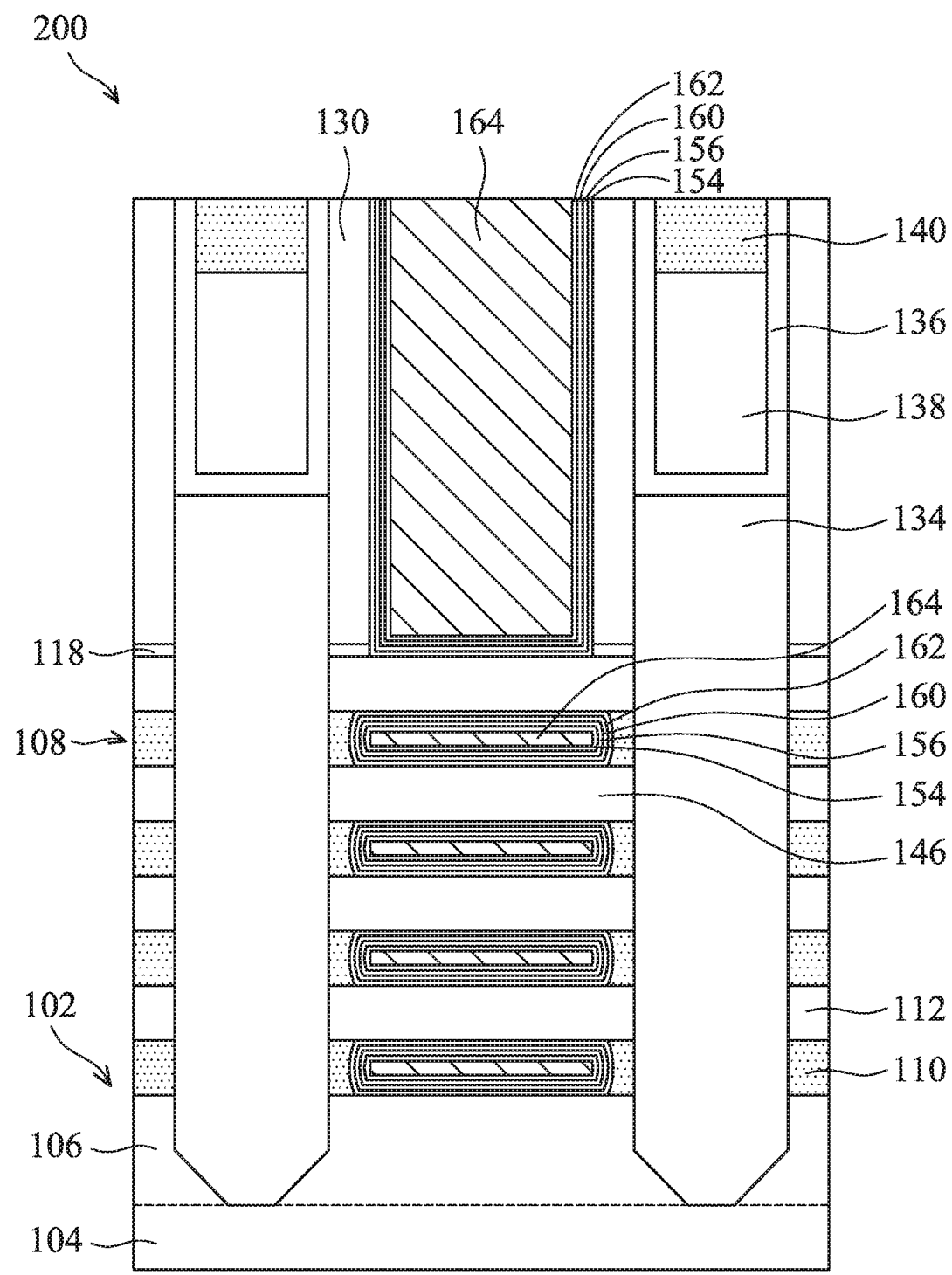
Figures 2, 2K:
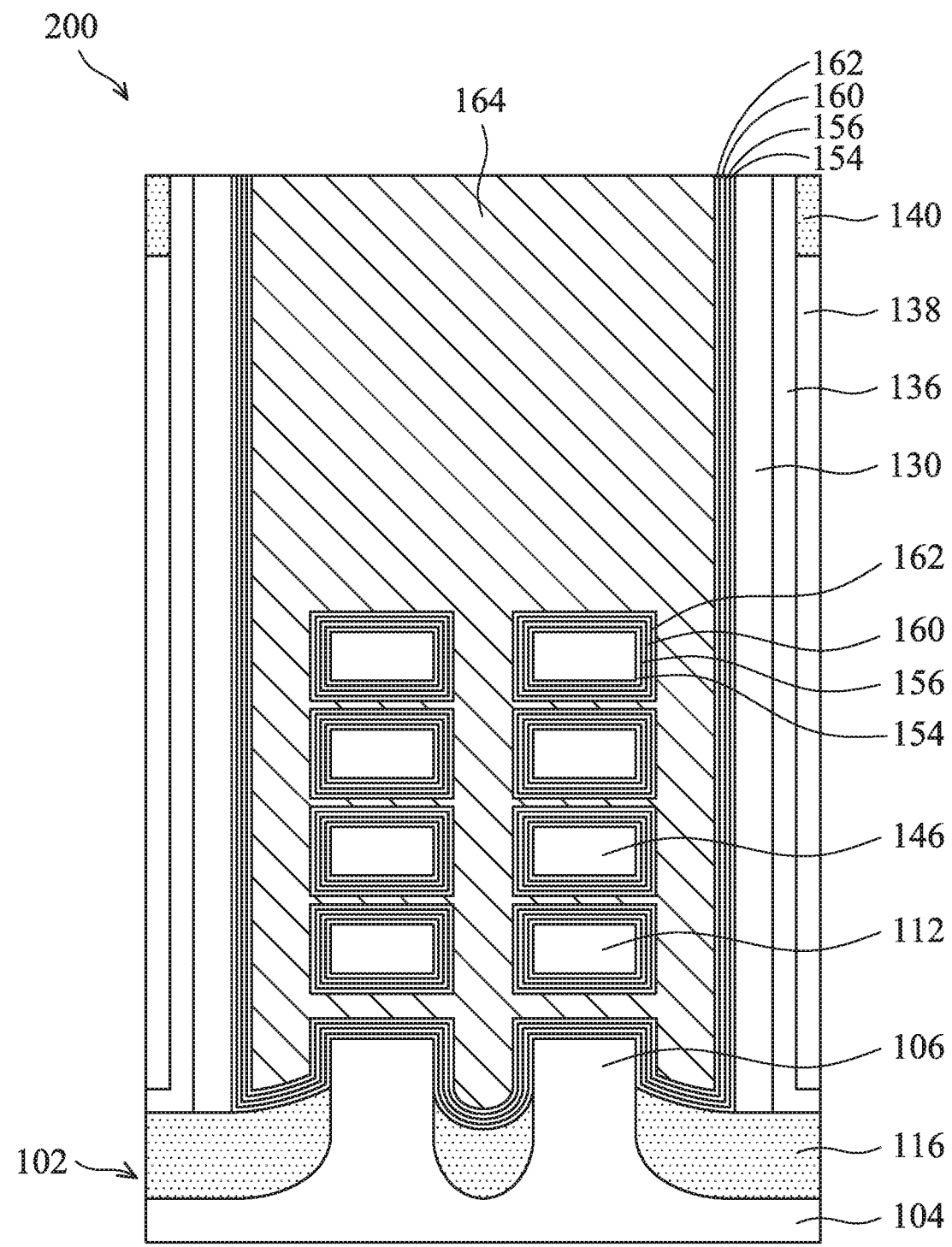
Figures 1, 3J:
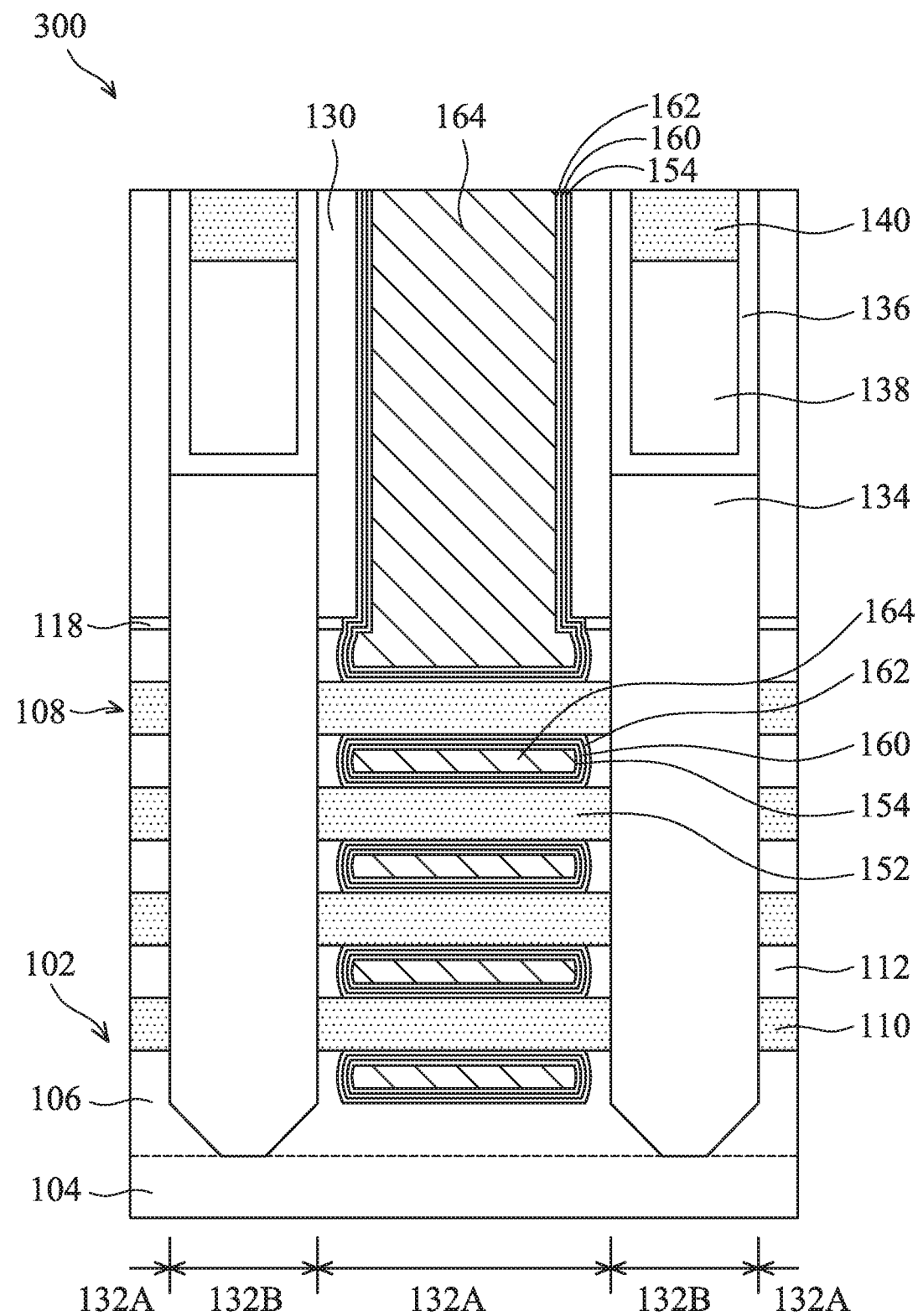
Figures 2, 3J:
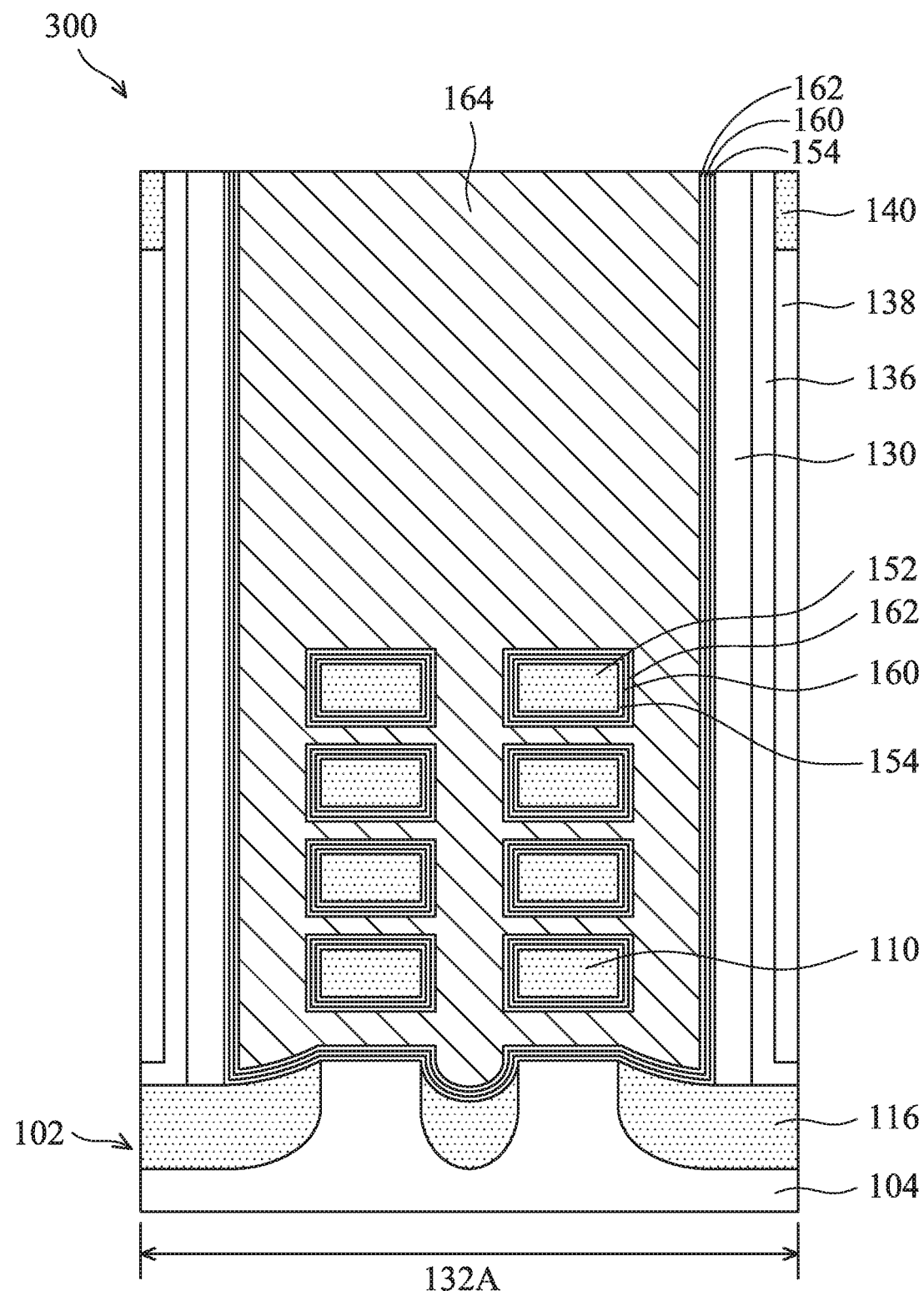
Figures 1, 3K:
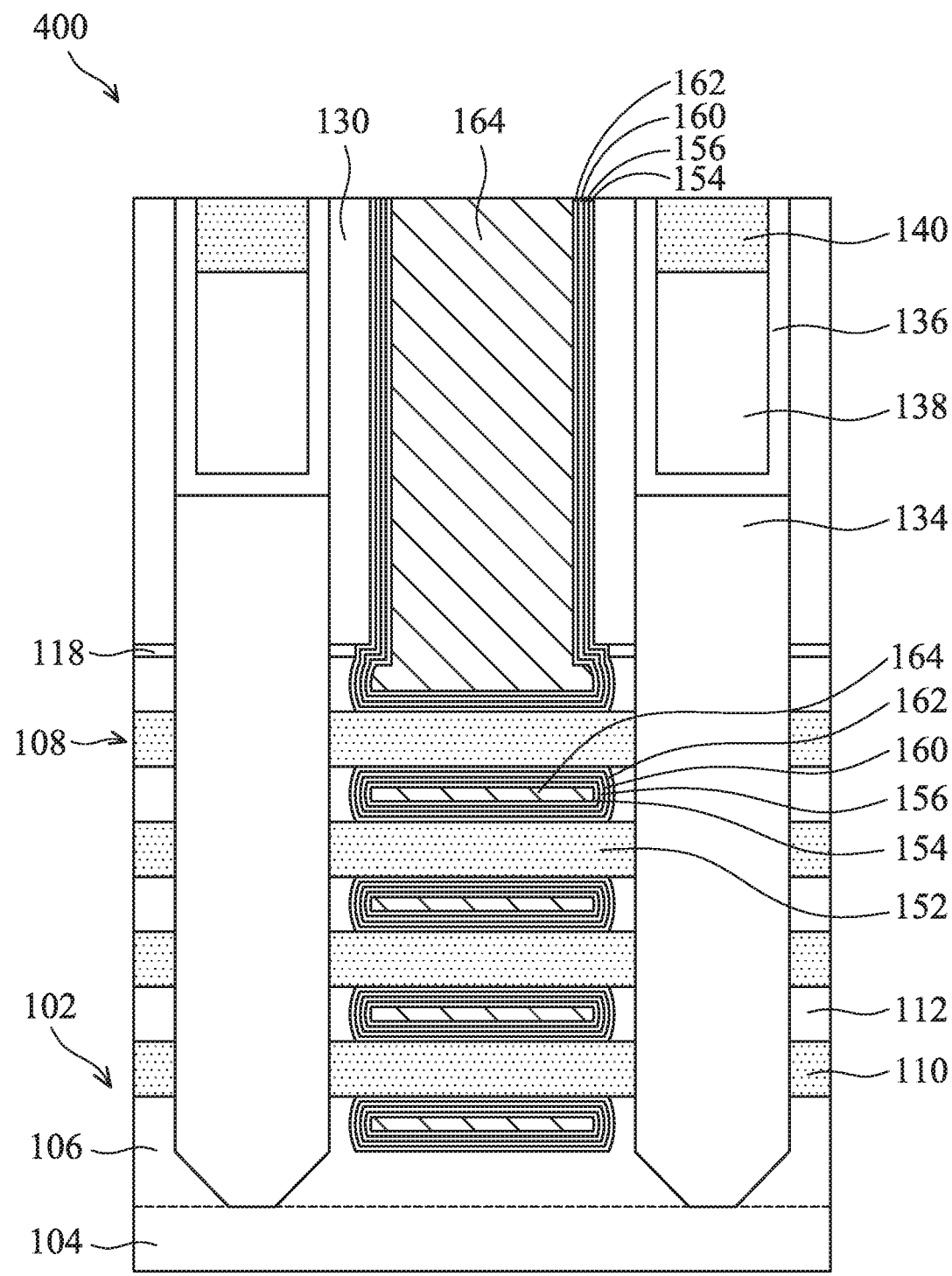
Figures 2, 3K:
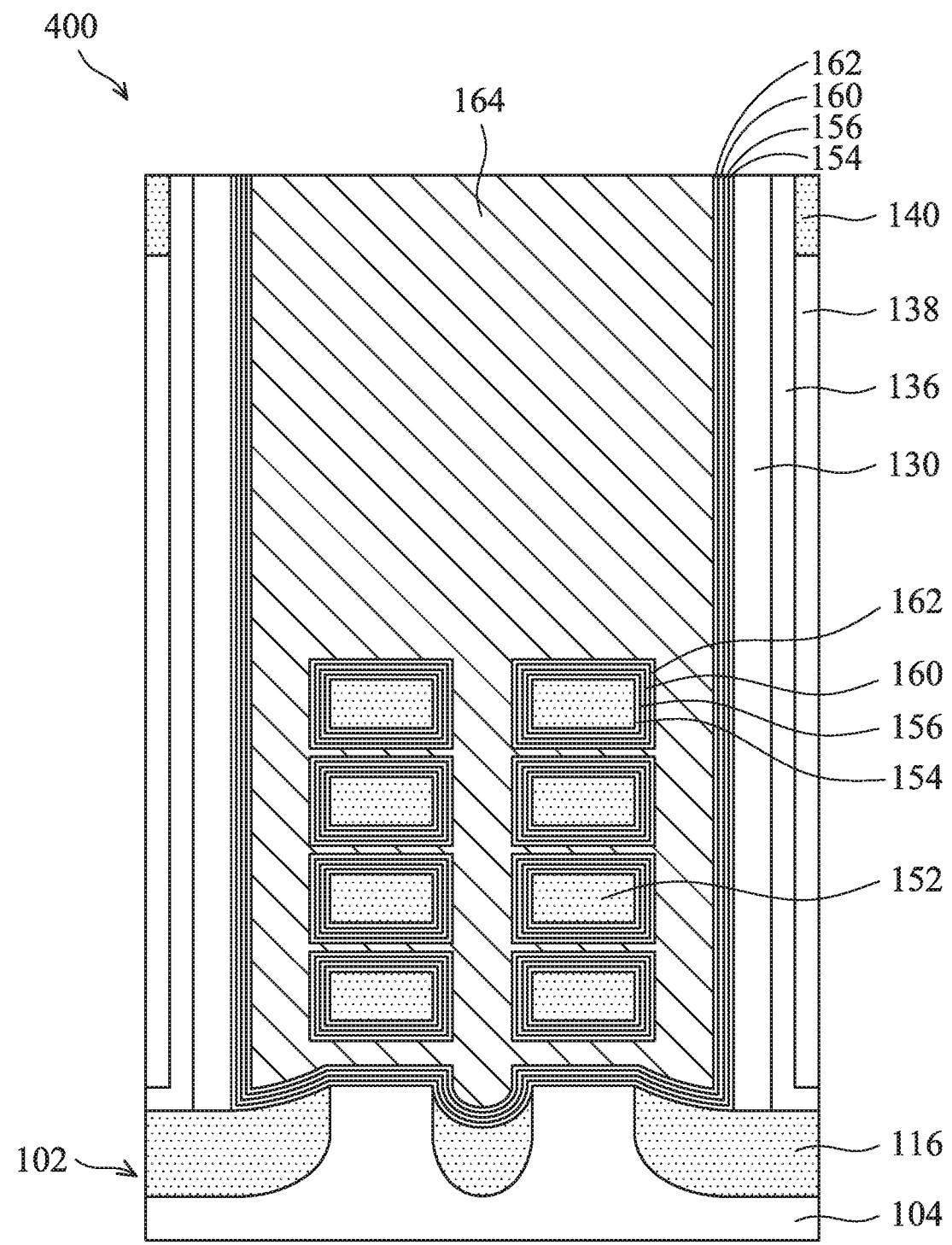

Afterwards, as shown in FIGS. 2J-1, 2J-2, 2K-1, 2K-2, 3J-1, 3J-2, 3K-1, 3K-2, FIGS. 2J-1 and 2J-2 represent the semiconductor device structure 100 positioned in the N-type region of the core region, FIGS. 2K-1 and 2K-2 represent the semiconductor device structure 200 positioned in the N-type region of the input-output region. FIGS. 3J-1 and 3J-2 represent the semiconductor device structure 300 positioned in the P-type region of the core region, FIGS. 3K-1 and 3K-2 represent the semiconductor device structure 400 positioned in the P-type region of the input-output region.

As shown in FIGS. 2J-1, 2J-2, 2K-1, 2K-2, 3J-1, 3J-2, 3K-1, 3K-2, an additional layer 160, a high-k dielectric layer 162, and a gate electrode 164 are sequentially formed, in accordance with some embodiments.

As shown in FIGS. 2J-1 and 2J-2, the additional layer 160 in the N-type region of the core region conformally covers and surrounds the protective layer 154, in accordance with some embodiments. As shown in FIGS. 2K-1 and 2K-2, the additional layer 160 in the N-type region of the input-output region conformally covers and surrounds the dielectric layer 156, in accordance with some embodiments.

As shown in FIGS. 3J-1 and 3J-2, the additional layer 160 in the P-type region of the core region conformally covers and surrounds the protective layer 154, in accordance with some embodiments. As shown in FIGS. 3K-1 and 3K-2, the additional layer 160 in the P-type region of the input-output region conformally covers and surrounds the dielectric layer 156, in accordance with some embodiments.

In some embodiments, the additional layer 160 includes a silicon element, nitrogen element, and/or sulfur element. In some embodiments, the additional layer 160 is made of silicon oxide, silicon nitride, silicon oxynitride, another suitable material, or a combination thereof.

Embodiments of the disclosure have many variations and are not limited to the embodiments mentioned above. In some other embodiments, no additional layer 160 is formed in the N-type region of the core region. In some other embodiments, no additional layer 160 is formed in the N-type region of the input-output region. In some other embodiments, no additional layer 160 is formed in the P-type region of the core region. In some other embodiments, no additional layer 160 is formed in the P-type region of the input-output region.

Afterwards, as shown in FIGS. 2J-1, 2J-2, 2K-1, 2K-2, 3J-1, 3J-2, 3K-1, 3K-2, the high-k dielectric layer 162 is formed, in accordance with some embodiments.

As shown in FIGS. 2J-1 and 2J-2, the high-k dielectric layer 162 in the N-type region of the core region conformally covers and surrounds the additional layer 160, in accordance with some embodiments. As shown in FIGS. 2K-1 and 2K-2, the high-k dielectric layer 162 in the N-type region of the input-output region conformally covers and surrounds the additional layer 160, in accordance with some embodiments.

As shown in FIGS. 3J-1 and 3J-2, the high-k dielectric layer 162 in the P-type region of the core region conformally covers and surrounds the additional layer 160, in accordance with some embodiments. As shown in FIGS. 3K-1 and 3K-2, the high-k dielectric layer 162 in the P-type region of the input-output region conformally covers and surrounds the additional layer 160, in accordance with some embodiments.

In some embodiments, the high-k dielectric layer 162 is made of metal oxide, metal nitride, metal silicide, transition metal oxide, transition metal nitride, transition metal silicide, transition metal oxynitride, metal aluminate, zirconium silicate, zirconium aluminate. For example, the material of the high-k dielectric layer 162 may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, any other suitable high-k dielectric material, or a combination thereof.

Afterwards, as shown in FIGS. 2J-1, 2J-2, 2K-1, 2K-2, 3J-1, 3J-2, 3K-1, 3K-2, the gate electrode 164 is formed over the high-k dielectric layer 162 and formed in the space between the semiconductor nanowires 146 and/or between the semiconductor nanowires 152, in accordance with some embodiments. In some embodiments, the high-k dielectric layer 162 and the gate electrode 164 collectively referred to as a gate structure.

As shown in FIGS. 2J-1 and 2J-2, the gate electrode 164 in the N-type region of the core region positioned over the high-k dielectric layer 162 and positioned in the space between the semiconductor nanowires 146, in accordance with some embodiments. As shown in FIGS. 2J-1 and 2J-2, the gate electrode 164 in the N-type region of the core region surrounds the high-k dielectric layer 162, and the gate structure formed by the gate electrode 164 and the high-k dielectric layer 162 surrounds the semiconductor nanowire 146, in accordance with some embodiments.

As shown in FIGS. 2J-1 and 2J-2, the source/drain portions 134 are adjacent to the opposite sides of the gate structure, in accordance with some embodiments. As shown in FIGS. 2J-1 and 2J-2, the spacer elements 130 are adjacent to the opposite sides of the gate structure, in accordance with some embodiments.

As shown in FIGS. 2J-1 and 2J-2, the protective layer 154 in the N-type region of the core region is between the gate structure and the semiconductor nanowire 146, in accordance with some embodiments. As shown in FIGS. 2J-1 and 2J-2, the additional layer 160 in the N-type region of the core region is between the protective layer 154 and the gate structure.

As shown in FIGS. 2K-1 and 2K-2, the gate electrode 164 in the N-type region of the input-output region positioned over the high-k dielectric layer 162 and positioned in the space between the semiconductor nanowires 146, in accordance with some embodiments. As shown in FIGS. 2K-1 and 2K-2, the gate electrode 164 in the N-type region of the input-output region surrounds the high-k dielectric layer 162, and the gate structure formed by the gate electrode 164 and the high-k dielectric layer 162 surrounds the dielectric layer 156 and the semiconductor nanowire 146, in accordance with some embodiments.

As shown in FIGS. 2K-1 and 2K-2, the source/drain portions 134 are adjacent to the opposite sides of the gate structure, in accordance with some embodiments. As shown in FIGS. 2K-1 and 2K-2, the spacer elements 130 are adjacent to the opposite sides of the gate structure, in accordance with some embodiments.

As shown in FIGS. 2K-1 and 2K-2, the protective layer 154 in the N-type region of the input-output region is between the dielectric layer 156 and the semiconductor nanowire 146, in accordance with some embodiments. As shown in FIGS. 2K-1 and 2K-2, the additional layer 160 in the N-type region of the input-output region is between the dielectric layer 156 and the gate structure formed by the gate electrode 164 and the high-k dielectric layer 162, in accordance with some embodiments.

As shown in FIGS. 2K-1 and 2K-2, the dielectric layer 156 is positioned between the spacer elements 130 and the gate structure formed by the gate electrode 164 and the high-k dielectric layer 162, in accordance with some embodiments. As shown in FIGS. 2K-1 and 2K-2, the semiconductor nanowire 146 surrounded by the dielectric layer 156 is positioned in the N-type region of the input-output region.

As shown in FIGS. 3J-1 and 3J-2, the gate electrode 164 in the P-type region of the core region positioned over the high-k dielectric layer 162 and positioned in the space between the semiconductor nanowires 152, in accordance with some embodiments. As shown in FIGS. 3J-1 and 3J-2, the gate electrode 164 in the P-type region of the core region surrounds the high-k dielectric layer 162, and the gate structure formed by the gate electrode 164 and the high-k dielectric layer 162 surrounds the semiconductor nanowire 152, in accordance with some embodiments.

As shown in FIGS. 3J-1 and 3J-2, the source/drain portions 134 are adjacent to the opposite sides of the gate structure, in accordance with some embodiments. As shown in FIGS. 3J-1 and 3J-2, the spacer elements 130 are adjacent to the opposite sides of the gate structure, in accordance with some embodiments.

As shown in FIGS. 3J-1 and 3J-2, the protective layer 154 in the P-type region of the core region is between the gate structure and the semiconductor nanowire 152, in accordance with some embodiments. As shown in FIGS. 3J-1 and 3J-2, the additional layer 160 in the P-type region of the core region is between the protective layer 154 and the gate structure.

As shown in FIGS. 3K-1 and 3K-2, the gate electrode 164 in the P-type region of the input-output region positioned over the high-k dielectric layer 162 and positioned in the space between the semiconductor nanowires 152, in accordance with some embodiments. As shown in FIGS. 3K-1 and 3K-2, the gate electrode 164 in the P-type region of the input-output region surrounds the high-k dielectric layer 162, and the gate structure formed by the gate electrode 164 and the high-k dielectric layer 162 surrounds the dielectric layer 156 and the semiconductor nanowire 152, in accordance with some embodiments.

As shown in FIGS. 3K-1 and 3K-2, the source/drain portions 134 are adjacent to the opposite sides of the gate structure, in accordance with some embodiments. As shown in FIGS. 3K-1 and 3K-2, the spacer elements 130 are adjacent to the opposite sides of the gate structure, in accordance with some embodiments.

As shown in FIGS. 3K-1 and 3K-2, the protective layer 154 in the P-type region of the input-output region is between the dielectric layer 156 and the semiconductor nanowire 152, in accordance with some embodiments. As shown in FIGS. 3K-1 and 3K-2, the additional layer 160 in the P-type region of the input-output region is between the dielectric layer 156 and the gate structure formed by the gate electrode 164 and the high-k dielectric layer 162, in accordance with some embodiments.

As shown in FIGS. 3K-1 and 3K-2, the dielectric layer 156 is positioned between the spacer elements 130 and the gate structure formed by the gate electrode 164 and the high-k dielectric layer 162, in accordance with some embodiments. As shown in FIGS. 3K-1 and 3K-2, the semiconductor nanowire 152 surrounded by the dielectric layer 156 is positioned in the P-type region of the input-output region.

In some embodiments, the gate electrode 164 includes a work function layer(s) and a gate electrode layer. The gate electrode layer is used to provide electrical connection between the work function layer(s) and a subsequently formed contact coupled to the gate electrode layer. In some embodiments, the gate electrode layer is made of a suitable metal material. The suitable metal material may include aluminum, tungsten, gold, platinum, cobalt, other suitable metal materials, an alloy thereof, or a combination thereof.

The work function layer(s) provides the desired work function for transistors to enhance device performance, including improved threshold voltage. In the embodiments of forming an NMOS transistor, the work function layer(s) can be an N-type metal capable of providing a work function value suitable for the device. The work function value is, for example, equal to or less than about 4.5 eV. The n-type metal may include metal, metal carbide, metal nitride, or a combination thereof. For example, the N-type metal includes tantalum, tantalum nitride, or a combination thereof. In some embodiments, the gate electrode 164 includes the N-type metal.

On the other hand, in the embodiments of forming a PMOS transistor, the work function layer(s) can be a P-type metal capable of providing a work function value suitable for the device. The work function value is, for example, equal to or greater than about 4.8 eV. The P-type metal may include metal, metal carbide, metal nitride, other suitable materials, or a combination thereof. For example, the P-type metal includes titanium, titanium nitride, other suitable materials, or a combination thereof. In some embodiments, the gate electrode 164 includes the P-type metal.

The work function layers may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof.

In some embodiments, the work function layers (such as an N-type metal) are deposited using an applicable deposition process. Examples of an applicable deposition process include a PVD process, a plating process, a CVD process, other applicable processes, and combinations thereof. Afterwards, the gate electrode layer is deposited over the work function layers by using, for example, a PVD process, a plating process, a CVD process, or the like.

In some embodiments, an additional material layer, a high-k dielectric material layer and a gate electrode material layer are sequentially deposited over the semiconductor device structures shown in FIGS. 2H-1, 2H-2, 2I-1, 2I-2, 3H-1, 3H-2, 3I-1, 3I-2.

In some embodiments, the additional material layer, the high-k dielectric material layer and the gate electrode material layer are sequentially deposited by using applicable deposition methods. In some embodiments, the applicable deposition methods for depositing the additional material layer may include a chemical vapor deposition (CVD) process, an atomic layer deposition (ALD) process, a thermal oxidation process, a spin-on coating process, other applicable processes, and combinations thereof.

In some embodiments, applicable deposition methods for depositing the high-k dielectric material layer include a chemical vapor deposition (CVD) process, an atomic layer deposition (ALD) process, a thermal oxidation process, a spin-on coating process, other applicable processes, and combinations thereof. In some embodiments, the applicable deposition methods for depositing the gate electrode material layer include a chemical vapor deposition (CVD) process, a physical vapor deposition (PVD) process, and other applicable methods.

Afterwards, a planarization process may be used to thin down and partially remove the additional material layer, the high-k dielectric material layer and the gate electrode material layer. The additional material layer, the high-k dielectric material layer and the gate electrode material layer may be partially removed until the protective element 140 is exposed. As a result, the additional layer 160, the high-k dielectric layer 162, and the gate electrode 164 are formed. In some embodiments, the planarization process includes a CMP process, a grinding process, a dry polishing process, an etching process, another applicable process, or a combination thereof.

In some embodiments, since the dummy gate dielectric layer, which has a thickness that is less than the thickness of the input-output gate dielectric layer, is deposited in the stage before the formation of the dummy gate electrode, the process window for depositing the dummy gate electrode is enlarged. For example, the dummy gate electrode may be filled into the space between two stack structures and between two fin portions. The formation of void in the space between two stack structures and between two fin portions is reduced or prevented. Therefore, the manufacturing yield may be improved, and the structural reliability of the semiconductor device structure is also improved.

In some embodiments, the protective element protects the interlayer dielectric layer from being damaged in the process which forms semiconductor nanowires. In addition, in some embodiments, the protective element also protects the interlayer dielectric layer from being damaged in the clean process performed before forming a protective layer surrounding the semiconductor nanowires. Therefore, the protective element may improve the manufacturing yield and improve structural stability.

In some embodiments, since the annealing process is performed on the gate dielectric layer after the formation of the semiconductor nanowires, the two semiconductor layers in the channel region do not intermix with each other at the interface between these layers. Therefore, the quality of the semiconductor nanowires may be improved. In addition, the manufacturing yield may also be improved.

In addition, since the dielectric layer is formed after the formation of the semiconductor nanowires, the protective layer, which is positioned between the semiconductor nanowires and the dielectric layer, may be formed after the formation of the semiconductor nanowires.

Furthermore, since the dielectric layer is formed after the formation of the semiconductor nanowires, rather than being formed before the formation of the semiconductor nanowires, the embodiments of the present disclosure prevent the dielectric layer from being damaged in the process before the formation of the semiconductor nanowires, or in the process for forming the semiconductor nanowires.

In some embodiments, since the semiconductor device structures positioned in the N-type region of the input-output region and the P-type region of the input-output region uses the semiconductor nanowires, rather than a fin structure, as a channel, the short channel effect of the semiconductor device structures positioned in the N-type region of the input-output region and the P-type region of the input-output region may be reduced or prevented.

Embodiments of the disclosure are not limited and may be applied to fabrication processes for any suitable technology generation. Various technology generations include a 20 nm node, a 16 nm node, a 10 nm node, or another suitable node.

In accordance with some embodiments, a semiconductor device structure is provided. The semiconductor device structure includes a substrate having a plurality of nanowires over an input-output region, and a protective layer surrounding the nanowires. The protective layer is made of silicon, silicon germanium, silicon oxide, silicon nitride, silicon sulfide, or a combination thereof. The semiconductor device structure also includes a high-k dielectric layer surrounding the protective layer, and a gate electrode surrounding the high-k dielectric layer. The semiconductor device structure further includes a source/drain portion adjacent to the gate electrode, and an interlayer dielectric layer over the source/drain portion.

In accordance with some embodiments, a semiconductor device structure is provided. The semiconductor device structure includes a substrate having a first fin portion in an input-output region and a second fin portion in a core region, and a first nanowire over the first fin portion in the input-output region. The semiconductor device structure also includes a second nanowire over the second fin portion in the core region, and a dielectric layer surrounding the first nanowire. The semiconductor device structure further includes a first gate structure surrounding the dielectric layer and the first nanowire, and a first source/drain portion adjacent to the first gate structure. Moreover, the semiconductor device structure includes a second gate structure surrounding the second nanowire, and a second source/drain portion adjacent to the second gate structure.

In accordance with some embodiments, a semiconductor device structure is provided. The semiconductor device structure includes a substrate having a fin portion in an input-output region, a nanowire over the fin portion in the input-output region, a gate structure surrounding the nanowire and having opposite sides, two spacer elements adjacent to the opposite sides of the gate structure, a dielectric layer between the spacer elements and the gate structure, and two source/drain portions adjacent to the two spacer elements respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate having a plurality of nanowires over an input-output region;
   a protective layer surrounding the nanowires, wherein the protective layer is made of silicon, silicon germanium, silicon oxide, silicon nitride, silicon sulfide, or a combination thereof;
   a high-k dielectric layer surrounding the protective layer;
   a gate electrode surrounding the high-k dielectric layer;
   a source/drain portion adjacent to the gate electrode;
   an interlayer dielectric layer over the source/drain portion;
   an etch stop layer between the source/drain portion and the interlayer dielectric layer; and
   a protective element over the interlayer dielectric layer, wherein a sidewall of the interlayer dielectric layer and a sidewall of the protective element are covered by the etch stop layer.

2. The semiconductor device structure as claimed in claim 1, further comprising:
   a dielectric layer surrounding the protective layer; and
   an additional layer surrounding the dielectric layer, wherein the additional layer comprises a silicon element, a nitrogen element, and/or a sulfur element, and wherein the dielectric layer is separated from the high-k dielectric layer by the additional layer.

3. The semiconductor device structure as claimed in claim 1, wherein the substrate has a fin portion in the input-output region, the nanowires are disposed over the fin portion, and a portion of the protective layer extends below a top surface of the fin portion.

4. The semiconductor device structure as claimed in claim 1, further comprising:
   a second protective layer over a topmost nanowire of the nanowires; and
   a spacer element over the second protective layer, wherein an upper portion of the protective layer is separated from the source/drain portion by the second protective layer and the spacer element, a lower portion of the protective layer is separated from the source/drain portion by a plurality of semiconductor layers, and the semiconductor layers and the nanowires are made of different materials.

5. A semiconductor device structure, comprising:
   a substrate having a fin portion in an input-output region;
   a nanowire over the fin portion in the input-output region;
   a gate structure surrounding the nanowire and having opposite sides;
   two spacer elements adjacent to the opposite sides of the gate structure;
   a protective layer between the spacer elements and the gate structure and surrounding the nanowire;
   a dielectric layer between the protective layer and the gate structure and surrounding the protective layer, wherein the dielectric layer is separated from the nanowire by the protective layer and separated from the spacer elements by the protective layer; and
   two source/drain portions adjacent to the two spacer elements respectively.

6. The semiconductor device structure as claimed in claim 5, further comprising:
   an etch stop layer over each of the source/drain portions;
   an interlayer dielectric layer over the etch stop layer; and
   a protective element over the interlayer dielectric layer, wherein a material of the protective element is different from a material of the interlayer dielectric layer.

7. The semiconductor device structure as claimed in claim 6, wherein sidewalls of the protective element are separated from the gate structure by the etch stop layer and the spacer elements.

8. The semiconductor device structure as claimed in claim 5, wherein the nanowire is made of silicon, silicon germanium, germanium tin, silicon germanium tin, gallium arsenide, indium gallium arsenide, indium arsenide, or a combination thereof.

9. The semiconductor device structure as claimed in claim 5, wherein the dielectric layer is made of silicon oxide, silicon nitride, silicon oxynitride, or a combination thereof.

10. The semiconductor device structure as claimed in claim 5, further comprising:
    an additional layer between the dielectric layer and the gate structure.

11. The semiconductor device structure as claimed in claim 10, wherein the additional layer comprises a silicon element, a nitrogen element, and/or a sulfur element.

12. The semiconductor device structure as claimed in claim 5, wherein the protective layer and the dielectric layer has U-shape profiles over the nanowire.

13. The semiconductor device structure as claimed in claim 5, wherein top surfaces of the protective layer and the dielectric layer are coplanar with a top surface of the gate structure.

14. A semiconductor device structure, comprising:
    a substrate having a fin portion in a core region;
    a nanowire over the fin portion in the core region;
    a gate structure surrounding the nanowire; and
    a source/drain portion adjacent to the gate structure;
    an interlayer dielectric layer over the source/drain portion;
    an etch stop layer between the source/drain portion and the interlayer dielectric layer; and
    a protective element over the interlayer dielectric layer, wherein a sidewall of the interlayer dielectric layer and a sidewall of the protective element are covered by the etch stop layer.

15. The semiconductor device structure as claimed in claim 14, further comprising:
    a protective layer between the gate structure and the nanowire.

16. The semiconductor device structure as claimed in claim 15, further comprising:
    an additional layer between the protective layer and the gate structure in the core region.

17. The semiconductor device structure as claimed in claim 16, wherein the additional layer is in direct contact with the protective layer.

18. The semiconductor device structure as claimed in claim 14, wherein a top surface of the protective element is coplanar with a top surface of the gate structure.

19. The semiconductor device structure as claimed in claim 14, wherein the gate structure comprises a high-k dielectric layer surrounding the nanowire and a gate electrode surrounding the high-k dielectric layer.

20. The semiconductor device structure as claimed in claim 14, further comprising:
    a spacer element over the nanowire and between the source/drain portion and the gate structure.

* * * * *